United States Patent
Meredith

(10) Patent No.: US 9,124,315 B2
(45) Date of Patent: Sep. 1, 2015

(54) COMPRESSED AMPLITUDE WIRELESS SIGNAL AND COMPRESSION FUNCTION

(71) Applicant: AT&T Mobility II LLC, Atlanta, GA (US)

(72) Inventor: Sheldon Kent Meredith, Marietta, GA (US)

(73) Assignee: AT&T MOBILITY II LLC, Atlanta, GA (US)

(*) Notice: Subject to any disclaimer, the term of this patent is extended or adjusted under 35 U.S.C. 154(b) by 108 days.

(21) Appl. No.: 14/072,667

(22) Filed: Nov. 5, 2013

(65) Prior Publication Data

US 2015/0126142 A1    May 7, 2015

(51) Int. Cl.

| | |
|---|---|
| H04B 1/64 | (2006.01) |
| H03G 7/00 | (2006.01) |
| H04B 1/04 | (2006.01) |
| H04W 52/04 | (2009.01) |

(52) U.S. Cl.
CPC .................. *H04B 1/04* (2013.01); *H04W 52/04* (2013.01); *H04B 2001/0416* (2013.01)

(58) Field of Classification Search
USPC ........... 455/114.2, 114.3, 127.1, 233.1, 245.1
See application file for complete search history.

(56) References Cited

U.S. PATENT DOCUMENTS

| | | | |
|---|---|---|---|
| 5,375,255 A | 12/1994 | Baier et al. | |
| 6,621,367 B2 | 9/2003 | Suzuki et al. | |
| 6,625,433 B1 * | 9/2003 | Poirier et al. | 455/232.1 |
| 6,944,427 B2 | 9/2005 | Haub et al. | |
| 7,130,602 B2 | 10/2006 | Ciccarelli | |
| 7,257,379 B2 | 8/2007 | Ozluturk et al. | |
| 7,295,813 B2 | 11/2007 | Haub et al. | |
| 7,299,021 B2 | 11/2007 | Parssinen et al. | |
| 7,366,470 B1 | 4/2008 | Green et al. | |
| 7,702,288 B2 | 4/2010 | Demir et al. | |
| 8,433,272 B2 | 4/2013 | Gudem et al. | |
| 2012/0146742 A1 | 6/2012 | Caron et al. | |
| 2012/0238230 A1 | 9/2012 | Tombak et al. | |

FOREIGN PATENT DOCUMENTS

JP    0 51 4813    *    5/1991    ............... H04B 1/40

OTHER PUBLICATIONS

Pan. "SiGe HBT Linear-In-db High Dynamic Range RF Envelope Detectors and Wideband High Linearity Amplifiers", UC San Diego Electronic Theses and Dissertations, 2010. Published online at [http://escholarship.org/uc/item/4bb7m36s], retrieved on Aug. 13, 2013, 115 pages.

* cited by examiner

*Primary Examiner* — Blane J Jackson
(74) *Attorney, Agent, or Firm* — Amin, Turocy & Watson, LLP

(57) ABSTRACT

Compression of an input signal prior to high power radio frequency (RF) amplification and transmission is disclosed. A compression device can receive an input signal and generate a compressed signal that can be passed to an amplification stage to reduce intermodulation effects. The compression device can further generate compression information that can be transmitted to enable a mobile device receiving an amplified version of the compressed signal and the compression information to decompress the amplified version of the compressed signal. Further, a mobile device that can receive an amplified compressed signal and compression information, such that the mobile device can decompress the amplified compressed signal, is also disclosed. The disclosed subject matter can enable use of lower cost, smaller, and less complex RF amplifiers within a wireless network environment.

20 Claims, 13 Drawing Sheets

US 9,124,315 B2

COMPRESSED AMPLITUDE WIRELESS SIGNAL AND COMPRESSION FUNCTION

TECHNICAL FIELD

The disclosed subject matter relates to transmission or reception of wireless signal in a wireless network environment.

BACKGROUND

By way of brief background, conventional transmission of wireless signal in a wireless network environment can employ amplification of an incoming signal to generate an amplified signal for transmission. Transmitted signals are typically amplified and highly faithful versions of the lower power input signal. Amplification in these conventional systems can typically occur in a linear region of the amplifier and is well understood. Whereas amplifiers can have limited linear response regions, sufficient amplification can employ a plurality of amplifiers in series such that each stage of amplification preferably occurs in a linear region of the respective amplifier to achieve sufficient amplification in the particular wireless network environment while remaining a faithful version of the low power input signal. As an example, a low power radio signal directly from a radio modulator can be amplified 30 dB from 100 mW average to a transmission signal of 100 W average. However, the example radio signal can have a 100:1 peak-to-average signal, and such peaks can result in transmission levels of 10,000 W, which can cause components of the amplifier cascade to operate in non-linear behavior regions. Multistage amplification can result in high power consumption, significant waste heat removal issues, and high equipment costs, especially in high power radio frequency (RF) transmission systems.

DETAILED DESCRIPTION

Figure 1:
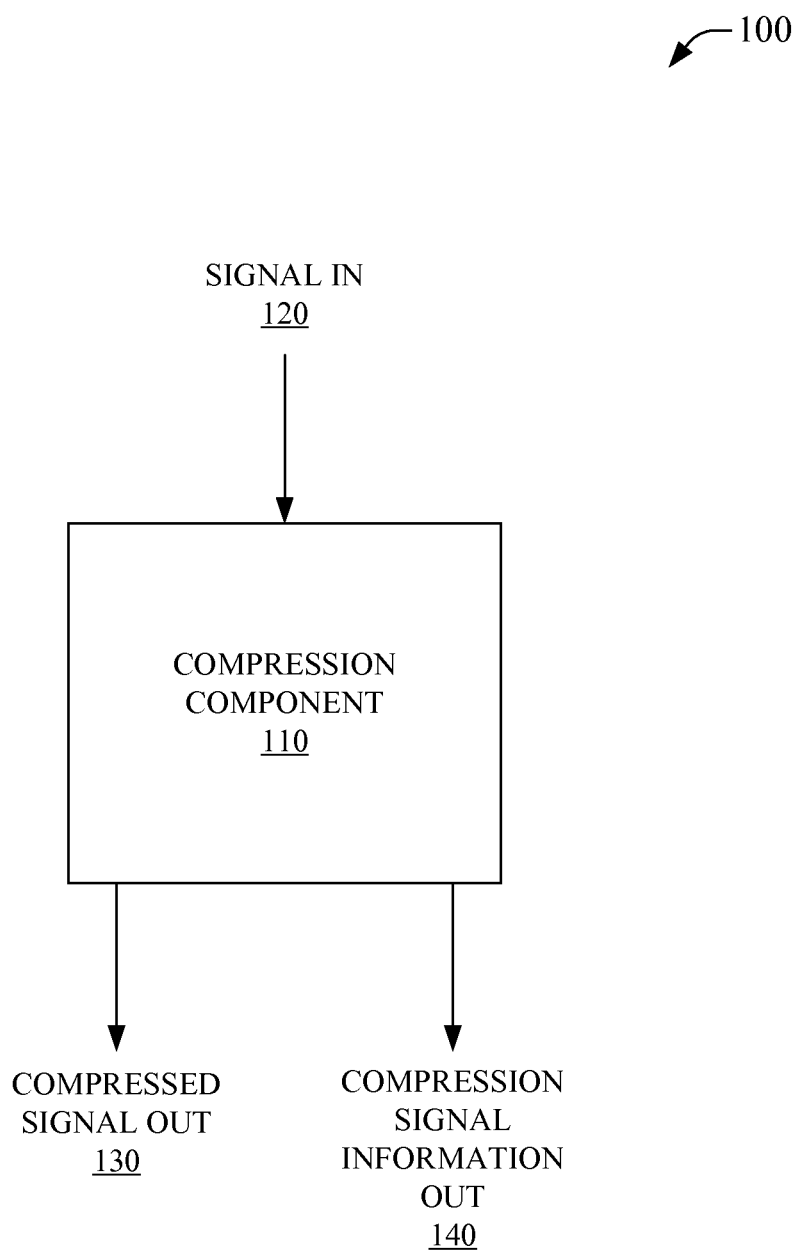
FIG. 1 is an illustration of a system that facilitates generating a compressed amplitude signal and compression signal information in accordance with aspects of the subject disclosure.

The subject disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure may be practiced without these specific details. In other instances, well-known structures and devices are shown in block diagram form in order to facilitate describing the subject disclosure.

Conventional wireless transmission systems, including those used for high power radio frequency (RF) transmission, typically significantly amplify low level input signals into highly faithful versions of the lower power input signal. Amplification can employ cascading amplifiers that allow amplification at each amplifier to occur in a linear region of that amplifier. Amplifiers are known to have limited linear response regions. As such, sufficient amplification of the low level input signal to a high level signal for transmission can employ a plurality of amplifiers in series with the disadvantage that these transmission grade amplifiers can be costly to purchase and operate. Further, the cascade of amplifiers may generate intermodulation effects where the input signal comprises occasional high signal levels. The cascade of amplifiers can be generally designed to operate with a well behaved input signal that is typically within a preferred signal-to-noise (SNR) range. Where the input signal comprises occasional high signal levels, e.g., exceeding the preferred SNR range, these signal peaks can result in intermodulation effects in the amplified signal. These intermodulation effects can result where the amplifiers function in non-linear operation regions, from operating passive components, like connectors and metal-metal junctions, in non-linear regions, etc. Intermodulation effects can show up in the receiving band of the base station. This can be problematic because the increase in the noise floor of the base station, due to intermodulation, can cause a decrease in the coverage area of the base station, which can in turn affect customers of the associated wireless network.

In contrast to conventional amplification techniques, an incoming signal can be analyzed to detect regions of the incoming signal that are likely to cause intermodulation effects. These regions of the incoming signal can be combined with a second signal to decrease or compress the time variant amplitude. Information about the second signal can then be transmitted along with an amplified version of the modified or compressed input signal to facilitate decompression at a receiver based on the information about the second signal. This allows amplification of a compressed amplitude version of the input signal such that the compressed amplitude is less likely to push an amplifier, or cascade of amplifiers, into a nonlinear region, thereby reducing the possibility of intermodulation effects.

An input signal can comprise time variant amplitude regions that do not push an amplifier into a nonlinear region and thus are unlikely to cause intermodulation effects. The input signal can also comprise time variant amplitude regions that can push the amplifier into a nonlinear region and therefore would be likely to cause intermodulation effects. Amplifier characterization is well understood and as such, the linear and nonlinear regions of an amplifier can be mapped and stored for use in the analysis of an input signal. An input signal can therefore be analyzed to determine, in time, when the input signal comprises sufficient amplitude to cause intermodulation for a given amplifier or set of amplifiers, based on known characteristics of the amplifier, or the set of amplifiers.

The determination that the input signal comprises a high amplitude region can be associated with generation of a second signal that can cause attenuation of the high amplitude region when the input signal and second signal are combined. In an aspect, the input signal can be delayed to allow sufficient time for analysis and second signal generation, such that the second signal can be combined with the delayed input signal at the correct time to effect the attenuation of the high amplitude region of the input signal. Whereas the second signal is related to attenuation of the high amplitude portions of the input signal, the second signal can be termed a compression signal. The input signal convolved with the compression signal can be termed a compressed signal. The compressed signal can then be passed to an amplifier component for amplification and then transmission to a receiving device. Further, information related to the compression signal can be generated and transmitted to the receiving device as compression signal information. The compression signal information can then be employed by the receiving device to deconvolve, or decompress, the corresponding received compressed signal that was a convolution of the compression signal and the input signal. This can allow a receiving device to recover amplitude information about the input signal that was compressed with the compression signal prior to amplification and transmission to reduce the occurrence of intermodulation effects associated with amplification of the uncompressed input signal.

In cases where the input signal does not include high amplitude signals, the incoming signal can be combined with a default compression signal so that the compressed input signal has the same peak amplitude ratios as the input signal. In other instances, the incoming signal can bypass the combining stage so that it is unaffected before entering the amplifier for transmission. The information about the second signal can then reflect that the second signal was the default compression signal or that no compression signal was applied. As an example, where the input signal does not contain any signal levels that are likely to cause intermodulation effects upon amplification for transmission, the input signal can be passed straight into a high power amplifier cascade and then transmitted along with compression signal information indicating that no compression was applied to the low level signal. As such, a receiving device can determine that no decompression need be done to the received high power signal based on the information that no compression was applied to the input signal before amplification. Similarly, where the input signal is compressed with a default signal, e.g., the input signal is convolved with a compression signal in a manner that does not affect the ratios of the input signal peak amplitudes, the receiving device can determine that no decompression need be applied to the received signal. This can be based on receiving information about the second signal being a default signal that imposes no changes to the peak ratios on the input signal.

In some embodiments, the compression signal can be a step compression signal. A step compression signal facilitates a discrete level of amplitude compression over one or more ranges of input amplitude signal level. As an example, over a first 10 dB of dynamic range for the input signal, no compression can be applied, over the next 10 dB of dynamic range an 0.5 dB compression per dB of amplitude increase can be applied, and for input signals over 20 dB, a 0.75 dB compression per dB of amplitude can be applied. This provides three discreet levels of amplitude compression, e.g., a 0 dB compression level, an 0.5 dB compression level, and an 0.75 dB compression level corresponding to a less than 10 dB input signal, a 10 dB-20 dB input signal, and a greater than 20 dB input signal, respectively. Given these example compression signal values, an input signal with a 30 dB dynamic range would then have a compressed dynamic range of only 17.5 dB based on 10 dB for the first 10 dB of input signal, 5 dB for the next 10 dB of input signal, and 2.5 dB for the next 10 dB of input signal. The compressed signal with a range of only 17.5 dB can be less likely to cause intermodulation effects upon amplification than the 30 dB range for a given amplification stage. Given that amplifier stages that are linear over larger input signal ranges are typically more expensive, compression of the input signal range can allow for the use of less expensive amplifier stages. However, amplification and transmission of the compressed signal can result in a receiving device receiving a compressed signal and, as such, information about the compression signal can also be communicated to the receiving device to facilitate decompression of the received compressed signal.

In another embodiment, the compression signal can be a continuous compression signal. A continuous compression signal facilitates amplitude compression as a continuous function of the input amplitude signal level. As an example, as the input signal amplitude increases, the level of compression applied can correspondingly increase. Continuous compression can comprise linear compression functions or nonlinear compression functions, e.g., a quadratic compression, an exponential compression, etc. This can provide for changing levels of compression over a continuous range of input signal amplitudes. A linear compression function can be, for example, 0.1 dB per dB of input power, such that at an input signal level of 10 dB there is 1 dB of compression, at an input of 15 dB there is 1.5 dB of compression, at 30 dB there is 3 dB of compression, etc. A nonlinear compression function can be, for example, quadratic where compression is equal to 0.01 times the square of the input signal level, such that, at 10 dB there is 1 dB of compression, at 15 dB there is 2.25 dB of compression, at 30 dB there is 9 dB of compression, etc. Nearly any basic or complex function can be employed in continuous compression. Much as for the step compression signal, the continuous compressed signal can be less likely to cause intermodulation effects when amplified and information about the continuous compression signal can also be communicated to the receiving device to allow decompression of the received continuous compressed signal.

To the accomplishment of the foregoing and related ends, the disclosed subject matter, then, comprises one or more of the features hereinafter more fully described. The following description and the annexed drawings set forth in detail certain illustrative aspects of the subject matter. However, these aspects are indicative of but a few of the various ways in which the principles of the subject matter can be employed. Other aspects, advantages and novel features of the disclosed subject matter will become apparent from the following detailed description when considered in conjunction with the provided drawings.

FIG. 1 is an illustration of a system 100, which facilitates generating a compressed amplitude signal and compression signal information in accordance with aspects of the subject disclosure. System 100 can include compression component 110. Compression component 110 can be part of a wireless transmission system, such as a high power RF transmission system. As an example, compression component 110 can be comprised in a NodeB, or other radio access network (RAN) component. Compression component 110 can facilitate compression of an input signal prior to amplification and transmission, for example, to reduce intermodulation effects that can be more common in conventional wireless transmission systems.

Compression component 110 can receive signal in 120. Signal in 120 can be, for example, a low power RF signal such as would be common as an input signal for land mobile radio RF transmitters. Signal 120 can be a time variant signal such as that produced by a radio modulator that, in conventional systems can be amplified without compression and transmitted as a high power RF signal and received by receives i mobile devices of a wireless network. Compression component 110 can apply compression to signal in 120.

Compression component 120 can generate compressed signal out 130 based on signal in 120. Further, compression component 110 can generate compressed signal information out 140. Compressed signal out 130 can be received by an amplifier for amplification prior to transmission. Amplification of compressed signal out 130 can reduce intermodulation as compared to direct amplification of signal in 120 without compression because the compression of the peak-to-peak ratios of signal in 120 can better constrain compressed signal out 130 to linear performance regions of the amplifier in comparison to direct amplification of signal in 120. Information about the compression applied to signal in 120 to generate compressed signal out 130 can be made available as compression signal information out 140.

Compression signal information out 140 can be generated to facilitate communication of information about the compression of signal in 120 to generate compressed signal out 130. As such, compression signal information out 140 can be transmitted to a receiver to enable the receiver to decompress a received compressed signal out 130 after amplification, transmission, and reception by the receiver. In an aspect, compression signal information out 140 can comprise a compression function, information related to determining a compression function, a compression signal, information related to generating a compression signal, an identifier of a compression function or compression signal used for compression of signal in 120, etc. As an example, compression signal information out 140 can be a time variant signal that can be mixed with a received amplified compressed signal out 130 to effect decompression and generate a facsimile of signal in 120 at the receiver. As another example, compression signal information out 140 can be an identifier enabling a receiver device to look up or determine locally the compression function used to compress signal in 120 into compressed signal out 130 and thereby enable the receiver device to decompress a received amplified compressed signal out 130. Where compression signal information out 140 comprises a code or identifier allowing look up of a compression function, this can consume minimal additional bandwidth to transmit compression signal information out 140. Further, even where compression signal information out 140 comprises a time variant compression signal, the additional bandwidth to transmit compression signal information out 140 can still be generally regarded as small, e.g., around a few percent of an RF channel, because it contains relatively little information compared to the information comprising either signal in 120 or compressed signal out 130.

In an aspect, compression of signal in 120 to generate compressed signal out 130 can reduce average power to peak power. This can reduce the need for expensive and complex highly linearized amplification stages prior to transmission of a high power RF signal to a receiver. While compression prior to amplification does increase the bandwidth burden by adding the transmission of compression signal information out 140 to the RF channel, this increase can generally be considered minimal and overall a cost savings can be realized in contrast to employing highly linearized amplification stages to faithfully create a facsimile of an uncompressed signal in 120. Further, where intermodulation is reduced, the noise floor of the receiving band can be better and therefore wireless coverage areas of the base station can be improved. Moreover, smaller, less complicated, and lower power amplifiers used for amplification of compressed signal out 130 can result in smaller base stations, more especially in that heat removal equipment footprints can be reduced where less cooling is needed because the amplifiers can be required to linearly amplify high ratio input signal peaks due to compression of the input signal.

As an example to contrast amplification of signal in 120 and amplification of compressed signal out 130, signal in 120 can have an average power of 0.1 W and a dynamic range of 30 dB, e.g., signal in 120 peak power is 100 W. Compressed signal out 130 can be based on signal in 120 and a compression scheme associated with compression signal information out 140. Compression of signal in 120 can result in generation of compressed signal out 130 having, for example, a dynamic range of 17.5 dB (see example of step compression hereinabove) rather than 30 dB for signal in 120, resulting in a peak power for compressed signal out 130 of about 5.6 W. Input signal 120 and compressed signal out 130 can, for example, then each be amplified by an amplifier stage with 30 dB gain. A 30 dB amplification of the peak power of signal in 120 would be about 100,000 W and can require a highly linearized amplifier that can cost, for example, $300,000-$500,000, generate significant heat that can need to be removed, and can have a substantial footprint. In contrast, a 30 dB amplification of the peak power of compressed signal out 130 can be around 5,600 W and can be accomplished with a smaller, cooler, and less expensive amplifier stage than would be needed for linear amplification of signal in 120. Amplified signal in 120 can be employed without decompression by a receiving device, in contrast to compressed signal out 130 that can employ decompression at a receiver device based on compression signal information out 140. Where the amplification stage for amplification of signal in 130 is not linear up to 100,000 W peak output power, amplification of signal in 130 can be associated with intermodulation that can reduce the coverage area for transmission of the amplified signal. In contrast, amplification to 5,600 W, e.g., for amplification of compressed signal out 130, can reduce intermodulation because the amplifier stage can be less rigorously engineered than compared to amplification for peak power up to 100,000 W.

Figure 2:
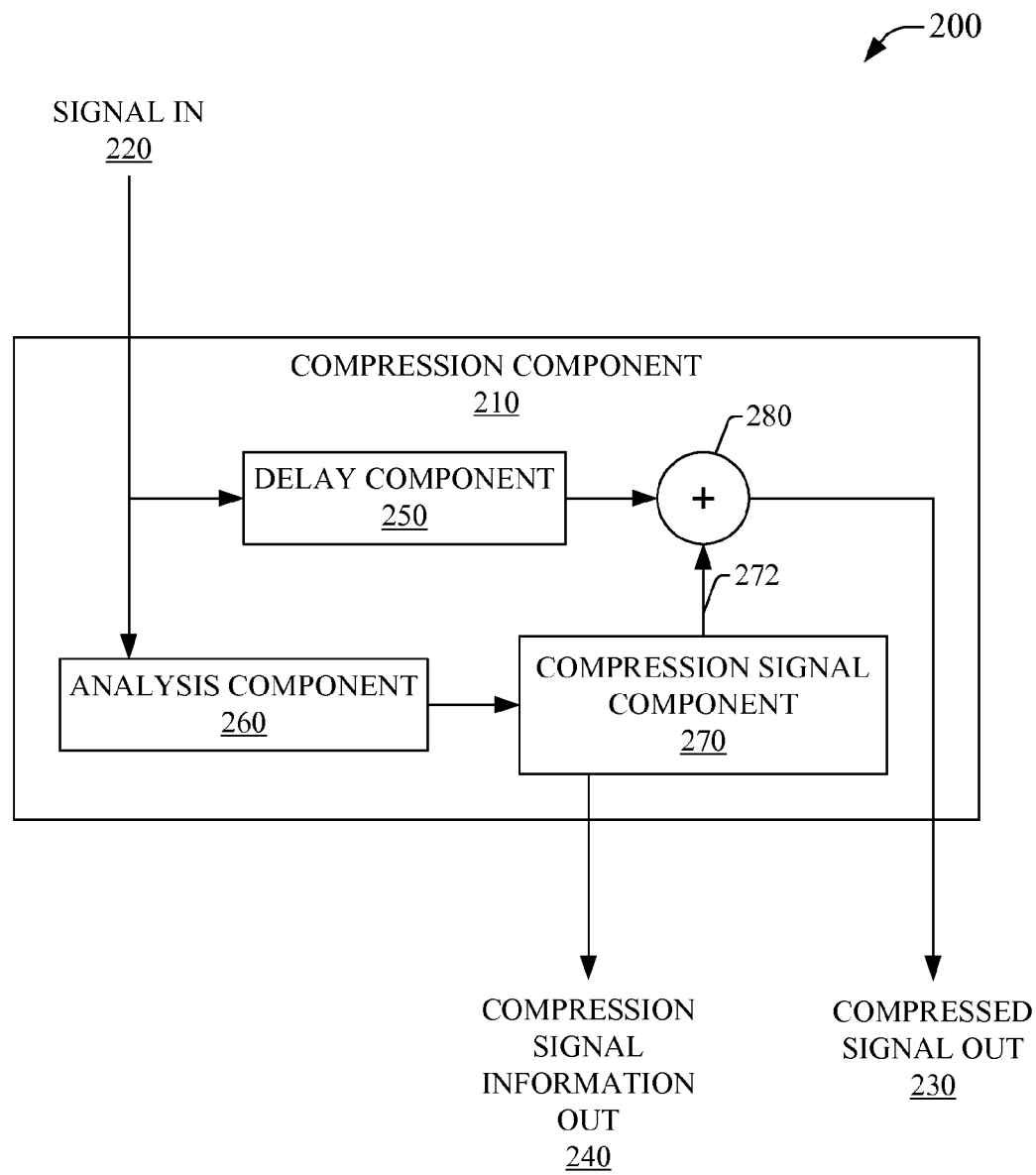
FIG. 2 is a depiction of a system that facilitates generating a compressed amplitude signal and compression signal information based on analysis of an input signal in accordance with aspects of the subject disclosure.

FIG. 2 is a depiction of a system 200 that can facilitate generating a compressed amplitude signal and compression signal information based on analysis of an input signal in accordance with aspects of the subject disclosure. System 200 can include compression component 210. Compression component 210 can facilitate compression of an input signal prior to amplification and transmission. Compression component 210 can receive signal in 220. Signal 220 can be a time variant signal, such as that produced by a radio modulator.

Compression component 210 can comprise delay component 250. Delay component 250 can introduce a delay to signal in 220. This delay can be based on a determination of the time to analyze signal in 220 for compression and time to generate a compression signal 272 to facilitate compression of signal in 220. Delayed signal in 220 can be passed to combiner component 280 that can combine delayed signal in with compression signal 272 to generate compressed signal out 230.

Compression component 210 can further comprise analysis component 260. Analysis component 260 can analyze signal in 220 to determine average amplitude to peak amplitude, e.g., average power to peak power. The analysis can further determine a compression function to be applied to signal in 220, e.g., delayed signal in, via combiner component 280. Compression signal component 270 can generate a compression signal, based on a determined compression function from analysis component 260, which can be combined with the delayed input signal at combiner component 280 to generate compressed signal out 230. Further, compression signal component 270 can facilitate access to compression signal information out 240 that can be information about the compression signal employed in compressing signal in 220 to form compressed signal out 230. In some embodiments analysis component 260 can generate compression signal information out 240, although this is not illustrated for simplicity and clarity.

As such, compression component 220 can generate compressed signal out 230 based on signal in 220. Further, compression component 210 can generate compressed signal information out 240. Compressed signal out 230 can be received by an amplifier for amplification prior to transmission. Amplification of compressed signal out 230 can reduce intermodulation as compared to direct amplification of signal in 220 without compression because the compression of the peak-to-peak ratios of signal in 220 can better constrain compressed signal out 230 to linear performance regions of the amplifier in comparison to direct amplification of signal in 220. Information about the compression applied to signal in 220 to generate compressed signal out 230 can be made available as compression signal information out 240.

Compression signal information out 240 can be generated to facilitate communication of information about the compression of signal in 220 to generate compressed signal out 230. As such, compression signal information out 240 can be transmitted to a receiver device to enable the receiver device to decompress a received compressed signal out 230 after amplification, transmission, and reception by the receiver device. In an aspect, compression signal information out 240 can comprise a compression function, information related to determining a compression function, a compression signal, information related to generating a compression signal, an identifier of a compression function or compression signal used for compression of signal in 220, etc.

In an aspect, compression of signal in 220 to generate compressed signal out 230 can reduce average amplitude to peak amplitude. This can reduce the need for expensive and complex highly linearized amplification stages prior to transmission of a high power RF signal to a receiver. Compression prior to amplification can increase bandwidth consumption by adding the transmission of compression signal information out 240 to the RF channel. Intermodulation can be reduced, such that the noise floor of the receiving band can be better and therefore wireless coverage areas of a base station can be improved. Further, smaller, less complicated, and lower power amplifiers can be used for amplification of compressed signal out 230. Compression also introduces delay into the transmission of information comprising signal in 220 because signal in 220 is analyzed and a compression signal is generated as part of generating compressed signal out 230. This delay can be considered in design of compression component 210 so as to minimize the effect of delay on communications that ideally occur in real time, e.g., voice communications on a wireless network can tolerate a limited amount of overall delay and delay introduced in compression component 210 should be kept low in these circumstances.

Figure 3:
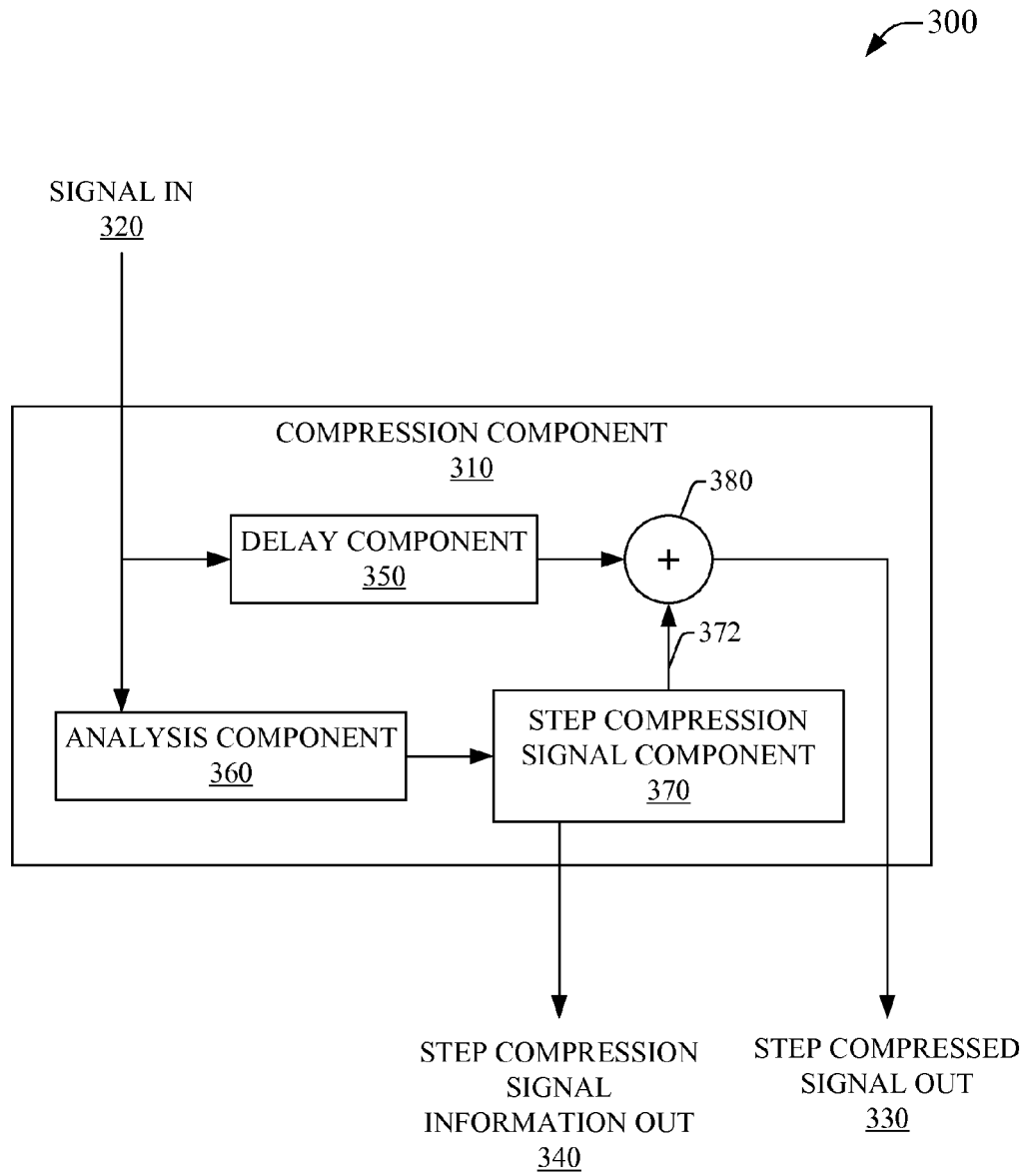
FIG. 3 illustrates a system that facilitates generating a compressed amplitude signal and step compression signal information based on analysis of an input signal in accordance with aspects of the subject disclosure.

FIG. 3 illustrates a system 300 that facilitates generating a compressed amplitude signal and step compression signal information based on analysis of an input signal in accordance with aspects of the subject disclosure. System 300 can include compression component 310. Compression component 310 can facilitate compression of an input signal prior to amplification and transmission. Compression component 310 can receive signal in 320. Signal in 320 can be a time variant signal, such as that produced by a radio modulator.

Compression component 310 can comprise delay component 350. Delay component 350 can introduce a delay to signal in 320. This delay can be based on a determination of the time to analyze signal in 320 for compression and time to generate a step compression signal 372 to facilitate compression of signal in 320. A delayed version of signal in 320 can be passed to combiner component 380 that can combine delayed signal in with step compression signal 372 to generate step compressed signal out 330.

Step compression can comprise compression at a discrete level over one or more ranges of input signal level. As an example, over a first 10 dB of dynamic range for the input signal, no compression can be applied, over the next 10 dB of dynamic range a 0.5 dB compression per dB of amplitude increase can be applied, and for input signals over 20 dB, a 0.75 dB compression per dB of amplitude can be applied. This can provide three discreet levels of amplitude compression, e.g., a 0 dB compression level, an 0.5 dB compression level, and an 0.75 dB compression level corresponding to a less than 10 dB input signal, a 10 dB-20 dB input signal, and a greater than 20 dB input signal, respectively. Given these example compression signal values, an input signal with a 30 dB dynamic range can then have a compressed dynamic range of only 17.5 dB based on 10 dB for the first 10 dB of input signal, 5 dB for the next 10 dB of input signal, and 2.5 dB for the next 10 dB of input signal. The compressed signal with a range of about 17.5 dB can be less likely to cause intermodulation effects when amplified in comparison to a 30 dB range for amplification of an uncompressed input signal. Given that amplifier stages that are linear over larger input signal ranges are typically more expensive, step compression of the input signal range can allow for the use of less expensive amplifier stages. However, amplification and transmission of the step compressed signal can result in a receiving device receiving a step compressed signal and, as such, information about the step compression can also be communicated to the receiving device to facilitate decompression of the received step compressed signal, e.g., step compressed signal out 330.

Compression component 310 can further comprise analysis component 360. Analysis component 360 can analyze signal in 320 to determine average amplitude to peak amplitude, e.g., average power to peak power. The analysis can further determine a step compression function to be applied to signal in 320, e.g., a delayed version of signal in 320, via combiner component 380. Step compression signal component 370 can generate a step compression signal, based on a determined step compression function from analysis component 360, which can be combined with the delayed input signal at combiner component 380 to generate step compressed signal out 330. Further, step compression signal component 370 can facilitate access to step compression signal information out 340 that can be information about the step compression signal employed in compressing signal in 320 to form step compressed signal out 330. In some embodiments, analysis component 360 can generate step compression signal information out 340, although this is not illustrated for simplicity and clarity.

As such, compression component 320 can generate step compressed signal out 330 based on signal in 320. Further, compression component 310 can generate step compressed signal information out 340. Step compressed signal out 330 can be received by an amplifier for amplification prior to transmission. Amplification of step compressed signal out 330 can reduce intermodulation as compared to direct amplification of signal in 320 without compression because the compression of signal in 320 can better constrain step compressed signal out 330 to linear performance regions of the amplifier in comparison to direct amplification of signal in 320. Information about the compression applied to signal in 320 to generate step compressed signal out 330 can be made available as step compression signal information out 340.

Step compression signal information out 340 can be generated to facilitate communication of information about the compression of signal in 320 to generate step compressed signal out 330. As such, step compression signal information out 340 can be transmitted to a receiver device to enable the receiver device to decompress a received step compressed signal out 330 after amplification, transmission, and reception by the receiver device. In an aspect, step compression signal information out 340 can comprise a step compression function, information related to determining a step compression function, a step compression signal, information related to generating a step compression signal, an identifier of a step compression function or step compression signal used for compression of signal in 320, etc.

In an aspect, compression of signal in 320 to generate step compressed signal out 330 can reduce average amplitude to peak amplitude. This can reduce the need for expensive and complex highly linearized amplification stages prior to transmission of a high power RF signal to a receiver. Compression prior to amplification can increase bandwidth consumption by adding the transmission of step compression signal information out 340 to the RF channel. Intermodulation can be reduced, such that the noise floor of the receiving band can be better and therefore wireless coverage areas of a base station can be improved. Further, smaller, less complicated, and lower power amplifiers can be used for amplification of step compressed signal out 330. Compression also introduces delay into the transmission of information comprising signal in 320 because signal in 320 is analyzed and a step compression signal is generated as part of generating step compressed signal out 330.

Figure 4:
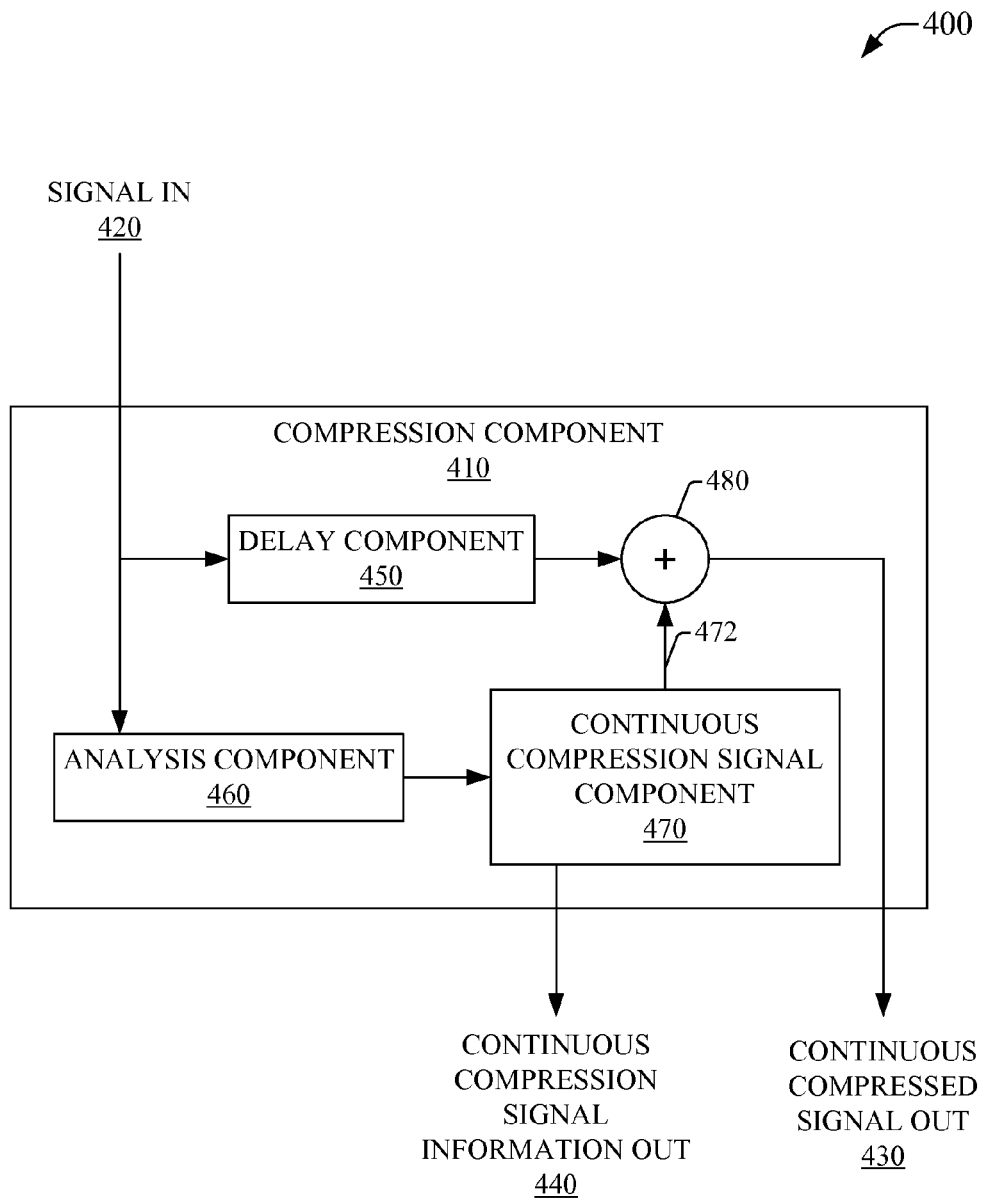
FIG. 4 illustrates a system that facilitates generating a compressed amplitude signal and continuous compression signal information based on analysis of an input signal in accordance with aspects of the subject disclosure.

FIG. 4 illustrates a system 400 that facilitates generating a compressed amplitude signal and continuous compression signal information based on analysis of an input signal in accordance with aspects of the subject disclosure. System 400 can include compression component 410. Compression component 410 can facilitate compression of an input signal prior to amplification and transmission. Compression component 410 can receive signal in 420. Signal in 420 can be a time variant signal, such as that produced by a radio modulator.

Compression component 410 can comprise delay component 450. Delay component 450 can introduce a delay to signal in 420. This delay can be based on a determination of the time to analyze signal in 420 for compression and time to generate a continuous compression signal 472 to facilitate compression of signal in 420. A delayed version of signal in 420 can be received by combiner component 480, which can combine the delayed signal in with continuous compression signal 472 to generate continuous compressed signal out 430.

A continuous compression signal can facilitate compression as a continuous function of the input signal level. As an example, as the input signal amplitude increases, the level of compression applied can correspondingly increase. Continuous compression can comprise linear compression functions or nonlinear compression functions, e.g., a quadratic compression, an exponential compression, etc. This can provide for changing levels of compression over a continuous range of input signal amplitudes. A linear compression function can be, for example, 0.1 dB per dB of input power, such that at an input signal level of 10 dB there is 1 dB of compression, at an input of 15 dB there is 1.5 dB of compression, at 30 dB there is 3 dB of compression, etc. A nonlinear compression function can be, for example, quadratic where compression is equal to 0.01 times the square of the input signal level, such that, at 10 dB there is 1 dB of compression, at 15 dB there is 2.25 dB of compression, at 30 dB there is 9 dB of compression, etc. Nearly any basic or complex function can be employed for continuous compression. A continuous compressed signal, e.g., continuous compressed signal out 430, can be less likely to cause intermodulation effects when amplified. Information about continuous compression signal 472 can also be communicated to the receiving device, e.g., continuous compression signal information out 440, to allow decompression of the received continuous compressed signal.

Compression component 410 can further comprise analysis component 460. Analysis component 460 can analyze signal in 420 to determine average amplitude to peak amplitude, e.g., average power to peak power. The analysis can further determine a continuous compression function to be applied to compress signal in 420, e.g., a delayed version of signal in 420, via combiner component 480. Continuous compression signal component 470 can generate a continuous compression signal, based on a determined continuous compression function from analysis component 460, which can be combined with the delayed input signal at combiner component 480 to generate continuous compressed signal out 430. Further, continuous compression signal component 470 can facilitate access to continuous compression signal information out 440 that can be information about the continuous compression signal employed in compressing signal in 420 to form continuous compressed signal out 430. In other embodiments, analysis component 460 can generate continuous compression signal information out 440, although this is not illustrated for simplicity and clarity.

As such, compression component 420 can generate continuous compressed signal out 430 based on signal in 420. Further, compression component 410 can generate continuous compressed signal information out 440. Continuous compressed signal out 430 can be received by an amplifier stage for amplification prior to transmission. Amplification of continuous compressed signal out 430 can reduce intermodulation as compared to direct amplification of signal in 420 without compression because the compression of signal in 420 can better constrain continuous compressed signal out 430 to linear performance regions of the amplifier stage in comparison to direct amplification of signal in 420. Information about the compression applied to signal in 420 to generate continuous compressed signal out 430 can be made available as continuous compression signal information out 440.

Continuous compression signal information out 440 can be generated to facilitate communication of information about the compression of signal in 420 to generate continuous compressed signal out 430. As such, continuous compression signal information out 440 can be transmitted to a receiver device to enable the receiver device to decompress a received continuous compressed signal out 430 after amplification, transmission, and reception by the receiver device. In an aspect, continuous compression signal information out 440 can comprise a continuous compression function, information related to determining a continuous compression function, a continuous compression signal, information related to generating a continuous compression signal, an identifier of a continuous compression function or continuous compression signal used for compression of signal in 420, etc.

In an aspect, compression of signal in 420 to generate continuous compressed signal out 430 can reduce average amplitude to peak amplitude. This can reduce the need for an expensive highly linearized amplification stage prior to transmission of a high power RF signal to a receiver. Compression prior to amplification can increase bandwidth consumption by adding the transmission of continuous compression signal information out 440 to the RF channel. Intermodulation can be reduced, such that the noise floor of the receiving band can be improved and therefore wireless coverage areas of a base station can be improved. Further, smaller, less complicated, and lower power amplifiers can be used for amplification of continuous compressed signal out 430. Compression also introduces delay into the transmission of information comprising signal in 420 because signal in 420 is analyzed and a continuous compression signal is generated as part of generating continuous compressed signal out 430.

Figure 5:
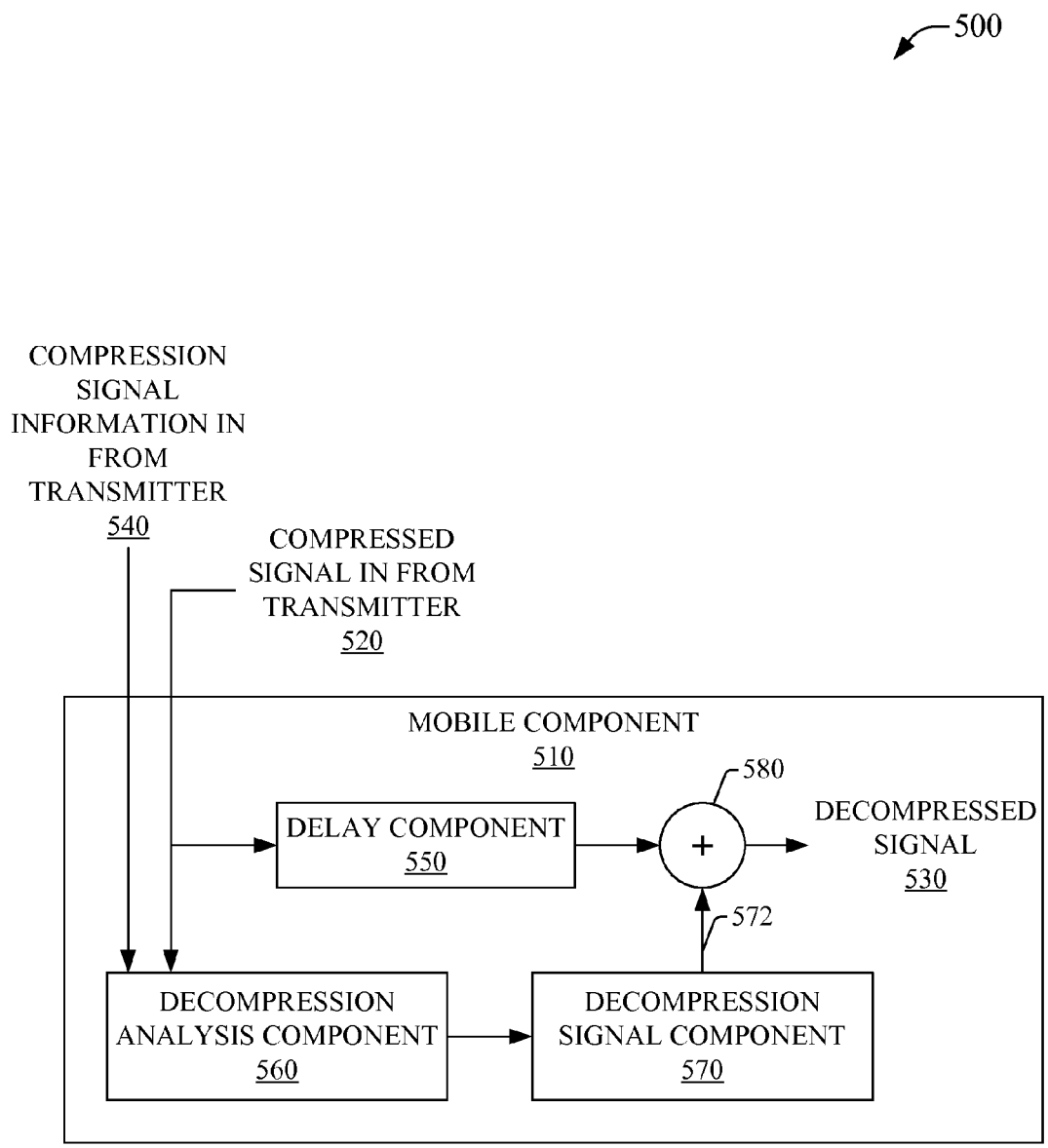
FIG. 5 illustrates a system that facilitates decompressing a received compressed amplitude signal and generating a decompression signal in accordance with aspects of the subject disclosure.

FIG. 5 illustrates a system 500 that facilitates decompressing a received compressed amplitude signal and generating a decompression signal in accordance with aspects of the subject disclosure. System 500 can include mobile component 510. Mobile component 510 can be a mobile device or can be comprised in a mobile device. A mobile device can be, for example, a mobile phone, a tablet computer, a smartphone, a vehicle, etc.

Mobile component 510 can receive compressed signal in from transmitter 520, hereinafter simply 'compressed signal 520'. Compressed signal 520 can be an amplified and transmitted version of compressed signal out 130, 230, 330, 430, etc. As such, compressed signal 520 can also be a compressed, amplified, and transmitted version of signal in 120, 220, 320, 420, etc.

Mobile device 510 can further receive compression signal information in from transmitter 540, hereinafter simply 'compression signal information 540'. Compression signal information 540 can be information about the compression of compressed signal 520. Compression signal information 540 can be a version of compression signal information out 140, 240, 340, 440, etc. In an aspect, compression signal information 540 can enable decompression of compressed signal 520.

Decompression of compressed signal 520 based on compression signal information 540 can facilitate generation of decompressed signal 530. Decompressed signal 530 can be a faithful version of signal in, e.g., signal in 120, 220, 320, 420, etc. Decompressed signal 530 can be generated by combiner component 580.

Combiner component 580 can receive a delayed version of compressed signal 520. The delay can be introduced by delay component 550. This delay can be based on a determination of the time to analyze compressed signal 520 for decompression and time to generate a decompression signal 572 to facilitate decompression of compressed signal 520.

Mobile component 510 can comprise decompression analysis component 560 that can receive compression signal information 540 and compressed signal 520. Analysis component 560 can determine a decompression function based on compression signal information 540. Decompression signal component 570 can generate a decompression signal 572 based on the determined decompression function from decompression analysis component 560. Decompression signal 572 can be combined with the delayed version of compressed signal 520 at combiner component 580 to generate decompressed signal 530.

In an aspect, decompressed signal 530 can be employed by a mobile device in much the same way as the mobile device would employ a received version of a non-compressed, amplified, and transmitted signal in 120, 220, 320, 420, etc. This is because decompressed signal 530 can be a faithful reproduction of signal in 120, 220, 320, 420, etc., wherein 'signal in' at the transmitter has been compressed prior to amplification and transmission, and is then decompressed by a mobile device comprising mobile component 510 based on compression signal information 540.

Figure 6:
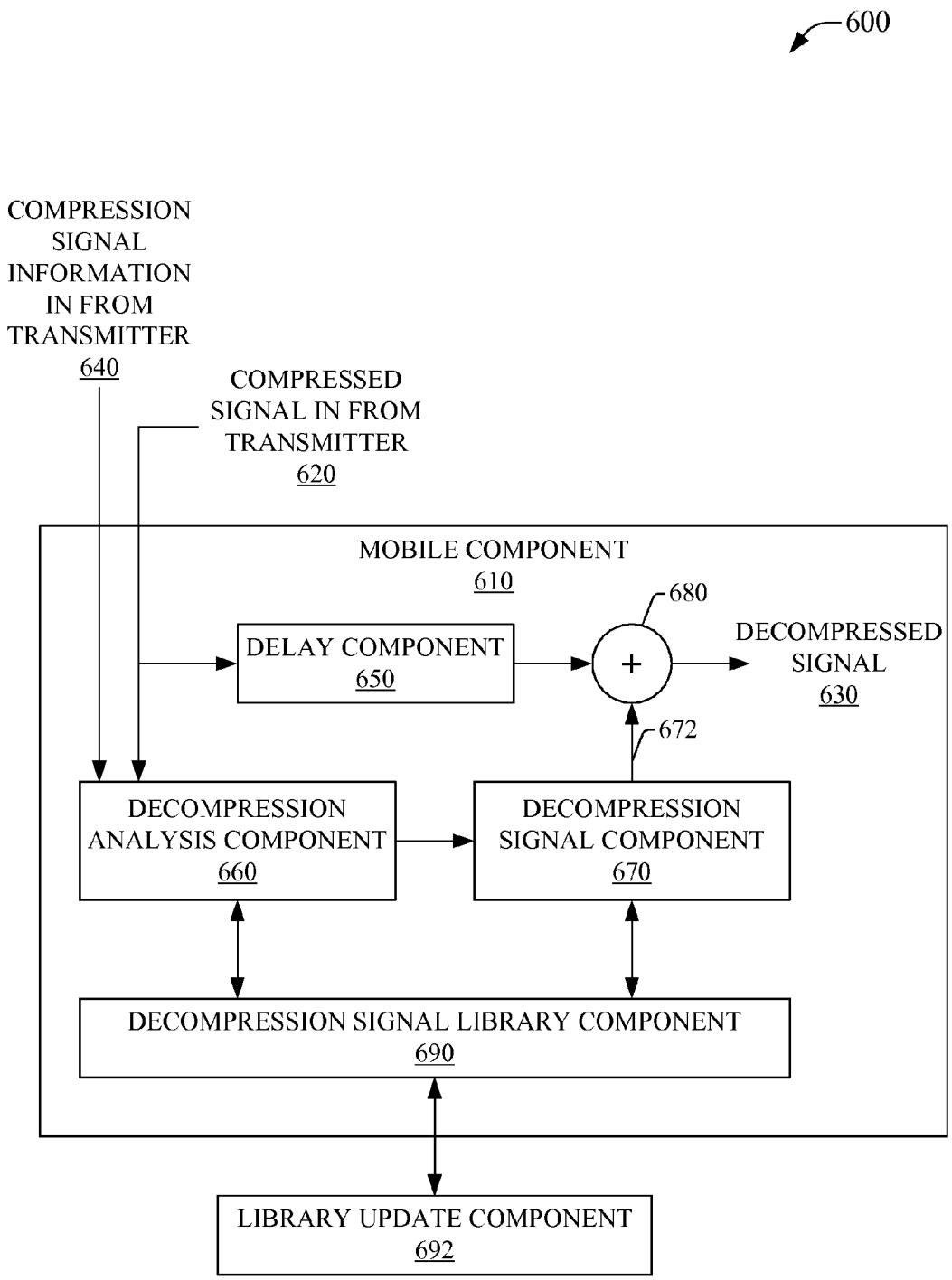
FIG. 6 illustrates a system that facilitates decompressing a received compressed amplitude signal and generating a decompression signal based on a decompression signal library in accordance with aspects of the subject disclosure.

FIG. 6 illustrates a system 600 that facilitates decompressing a received compressed amplitude signal and generating a decompression signal based on a decompression signal library in accordance with aspects of the subject disclosure. System 600 can include mobile component 610. Mobile component 610 can be a mobile device or can be comprised in a mobile device. Mobile component 610 can receive compressed signal in from transmitter 620, hereinafter simply 'compressed signal 620'. Compressed signal 620 can be an amplified and transmitted version of compressed signal out 130, 230, 330, 430, etc. As such, compressed signal 620 can also be a compressed, amplified, and transmitted version of signal in 120, 220, 320, 420, etc. Mobile device 610 can further receive compression signal information in from transmitter 640, hereinafter simply 'compression signal information 640'. Compression signal information 640 can be information about the compression of compressed signal 620. Compression signal information 640 can be a version of compressed signal information out 140, 240, 340, 440, etc. In an aspect, compression signal information 640 can enable decompression of compressed signal 620.

Decompression of compressed signal 620 based on compression signal information 640 can facilitate generation of decompressed signal 630. Decompressed signal 630 can be a faithful version of signal in, e.g., signal in 120, 220, 320, 420, etc. Decompressed signal 630 can be generated by combiner component 680. Combiner component 680 can receive a delayed version of compressed signal 620. The delay can be introduced by delay component 650. This delay can be based on a determination of the time to analyze compressed signal 620 for decompression and time to generate a decompression signal 672 to facilitate decompression of compressed signal 620.

Mobile component 610 can comprise decompression analysis component 660 that can receive compression signal information 640 and compressed signal 620. Decompression analysis component 660 can determine a decompression function based on compression signal information 640. The decompression function can be related to decompression signal information stored on decompression signal library component 690. As an example, where compression signal information 640 comprises a decompression function identifier or decompression signal identifier, the identifier can be employed to search the decompression signal library component 690 for a stored version of the corresponding decompression signal information. Where decompression signal library component 690 comprises the corresponding decompression signal information, this information can be made available to decompression signal component 670 to facilitate generation of decompression signal 672.

Decompression signal component 670 can generate decompression signal 672 based on the determined decompression function from decompression analysis component 660 and stored decompression signal information from decompression signal library component 690. Decompression signal 672 can be combined with the delayed version of compressed signal 620 at combiner component 680 to generate decompressed signal 630.

Decompression signal library component 690 can be communicatively coupled to library update component 692. In an embodiment, decompression signal library component 690 can receive an update to modify, delete, or store decompression signal information. As an example, a new decompression signal definition can be received from library update component 692 and stored on decompression signal library component 690. Library update component 692 can be local to mobile component 610, can be comprised in the component 610 (not illustrated), or can be located distant from mobile component 610, e.g., on a remote server, at a NodeB, etc. In an aspect, where the set of compression/decompression functions is defined, bandwidth consumption associated with transmitting a compression function, e.g., some embodiments of compression signal information out 140, 240, etc., can be further reduced by transmitting a compression identifier or decompression identifier that can be employed to look up corresponding decompression information locally. As an example, where compression signal information out 140 comprises an identifier identifying 'decompression signal gamma', then the gamma decompression signal need not actually be transmitted because the identifier can be transmitted instead such that 'decompression signal gamma' can be identified and then looked up at decompression signal library component 690. This can further reduce computations at mobile component 610 associated with a decompression analysis and speed up generation of decompressed signal 630.

In an aspect, decompressed signal 630 can be employed by a mobile device in much the same way as the mobile device would employ a received version of a non-compressed, amplified, and transmitted signal in 120, 220, 320, 420, etc. This is because decompressed signal 630 can be a faithful reproduction of signal in 120, 220, 320, 420, etc., wherein 'signal in' at the transmitter has been compressed prior to amplification and transmission, and is then decompressed by a mobile device comprising mobile component 610 based on compression signal information 640.

In view of the example system(s) described above, example method(s) that can be implemented in accordance with the disclosed subject matter can be better appreciated with reference to flowcharts in FIG. 7-FIG. 11. For purposes of simplicity of explanation, example methods disclosed herein are presented and described as a series of acts; however, it is to be understood and appreciated that the claimed subject matter is not limited by the order of acts, as some acts may occur in different orders and/or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a described example method in accordance with the subject specification. Further yet, two or more of the disclosed example methods can be implemented in combination with each other, to accomplish one or more aspects herein described. It should be further appreciated that the example methods disclosed throughout the subject specification are capable of being stored on an article of manufacture (e.g., a computer-readable medium) to allow transporting and transferring such methods to computers for execution, and thus implementation, by a processor or for storage in a memory.

Figure 7:
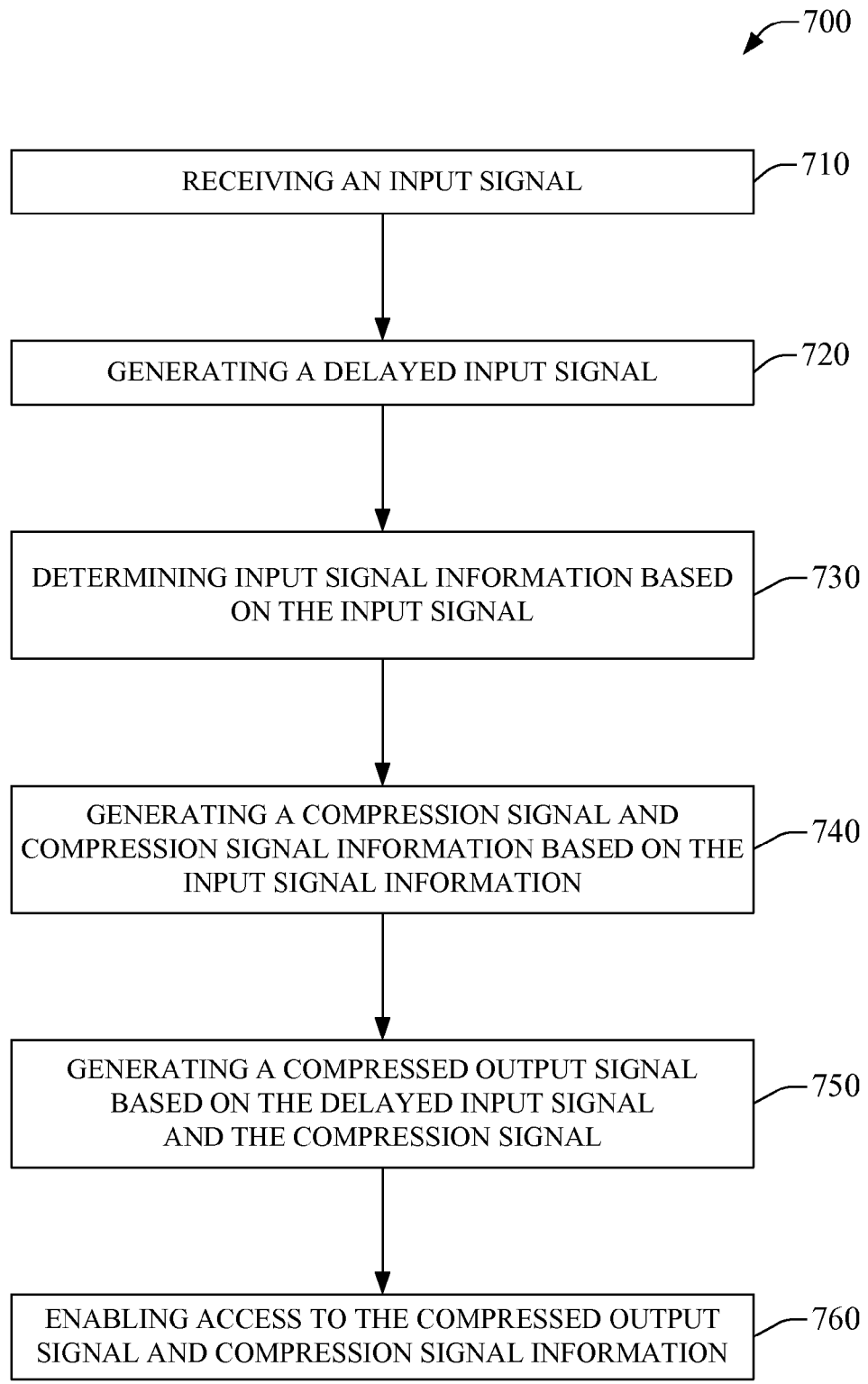
FIG. 7 illustrates a method facilitating generating a compressed amplitude signal and compression signal information in accordance with aspects of the subject disclosure.

FIG. 7 illustrates aspects of method 700 facilitating generating a compressed amplitude signal and compression signal information in accordance with aspects of the subject disclosure. At 710, method 700 can include receiving an input signal. An input signal can be, for example, a low power RF signal such as would be common as an input signal for land mobile radio RF transmitters. The input signal can be a time variant signal, such as that produced by a radio modulator that, in conventional systems, can be amplified without compression and transmitted as a high power RF signal and received by a receiver component in a mobile device of a wireless network.

At 720, method 700 can comprise generating a delayed input signal. The delayed input signal can be based on the input signal received at 710. In an aspect, the delayed input signal can be generated by passing the received input signal through a delay component, for example, a delay device, a length of signal conductor, etc.

At 730, method 700 can include determining input signal information based on the input signal received at 710. Input signal information can be determined from an analysis of the input signal and can comprise timing information, average power information, average voltage information, peak power information, peak voltage information, etc. Input signal information can be employed in determining a compression function to apply to the input signal to compress the amplitude of the input signal.

At 740, method 700 can generate a compression signal and compression signal information. The compression signal and compression signal information van be based on the input signal information from 730. In an embodiment, the compression signal can be convolved with the delayed input signal to generate a compressed output signal. Further, the compression signal information can comprise information related to the compression signal. Compression signal information can be transmitted to a receiver device to enable the receiver to decompress a received compressed output signal after amplification, transmission, and reception by the receiver device. In an aspect, compression signal information can comprise a compression function, information related to determining a compression function, a compression signal, information related to generating a compression signal, an identifier of a compression function or compression signal used for compression of a delayed input signal, etc. As an example, compression signal information can be a time variant signal that can be mixed with a received amplified compressed output signal to effect decompression and generate a facsimile of the input signal form 710 at a receiver device. As another example, compression signal information can be an identifier enabling a receiver device to look up or determine locally the compression function used to compress the input signal from 710 into compressed output signal and thereby enable the receiver device to decompress a received amplified compressed output signal.

At 750, method 700 can include generating a compressed output signal based on the delayed input signal and the compression signal. Generating the compressed output signal can be performed on a combiner component, e.g., combiner component 280, 380, 480, 580, etc. Compressed output signal can reduce average power to peak power in comparison to the input signal. This can reduce the need for expensive and complex highly linearized amplification stages prior to transmission of a high power RF signal to a receiver. Generally, compression prior to amplification does increase the bandwidth burden by adding the transmission of compression signal information to an RF channel. Further, where intermodulation is reduced, the noise floor of the receiving band can be better and therefore wireless coverage areas of the base station can be improved. Moreover, smaller, less complicated, and lower power amplifiers used for amplification of compressed output signal can result in smaller base stations, more especially in that heat removal equipment footprints can be reduced where less cooling is needed because the amplifiers can be required to linearly amplify high ratio input signal peaks due to compression of the input signal.

At 760, method 700 can include facilitating access to the compressed output signal and compression signal information. At this point method 700 can end. Access to the compressed output signal can facilitate amplification and transmission of the compressed output signal. Further, access to the compression signal information can facilitate transmission of the compression signal information on an RF channel to enable a receiving device to decompress the received amplified and transmitted compressed output signal.

Figure 8:
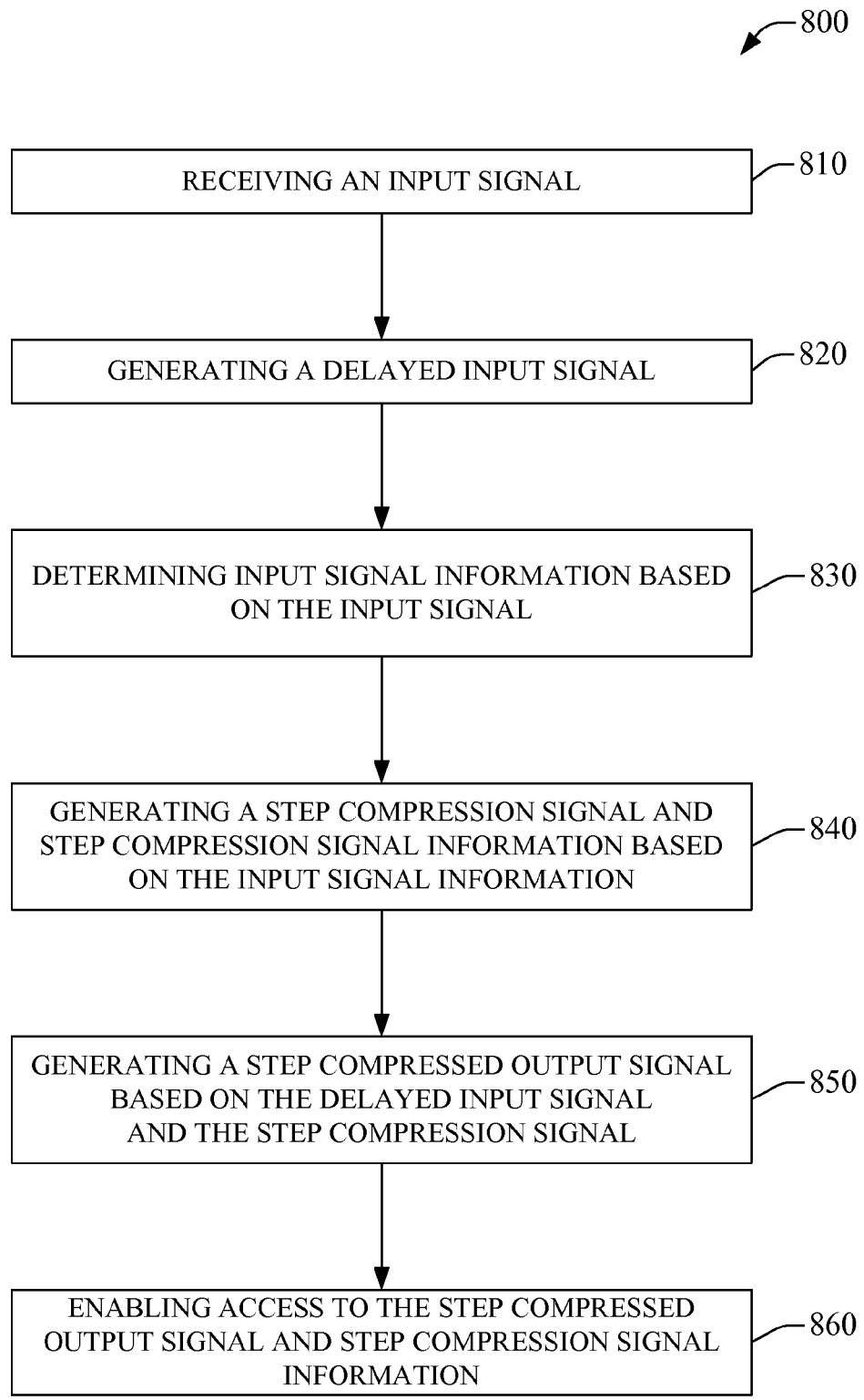
FIG. 8 illustrates a method facilitating generating a step compressed amplitude signal and step compression signal information in accordance with aspects of the subject disclosure.

FIG. 8 illustrates aspects of method 800 facilitating generating a step compressed amplitude signal and step compression signal information in accordance with aspects of the subject disclosure. At 810, method 800 can include receiving an input signal, such as a low power RF signal or a time variant signal such as that produced by a radio modulator. At 820, method 800 can comprise generating a delayed input signal. The delayed input signal can be based on the input signal received at 810. At 830, method 800 can include determining input signal information based on the input signal received at 810. Input signal information can be determined from an analysis of the input signal. Input signal information can be employed in determining a compression function to apply to the input signal to compress the amplitude of the input signal.

At 840, method 800 can generate a step compression signal and step compression signal information. The step compression signal and step compression signal information can be based on the input signal information from 830. In an embodiment, the step compression signal can be convolved with the delayed input signal to generate a step compressed output signal. Further, the step compression signal information can comprise information related to the step compression signal. Step compression signal information can be transmitted to a receiver device to enable the receiver to decompress a received step compressed output signal after amplification, transmission, and reception by the receiver device. In an aspect, step compression signal information can comprise a step compression function, information related to determining a step compression function, a step compression signal, information related to generating a step compression signal, an identifier of a step compression function or step compression signal used for step compression of a delayed input signal, etc.

Step compression can comprise compression at a discrete level over one or more ranges of input signal level. As an example, over a first 10 dB of dynamic range for the input signal, no compression can be applied, over the next 10 dB of dynamic range a 0.5 dB compression per dB of amplitude increase can be applied, and for input signals over 20 dB, a 0.75 dB compression per dB of amplitude can be applied. This can provide three discreet levels of amplitude compression, e.g., a 0 dB compression level, an 0.5 dB compression level, and an 0.75 dB compression level corresponding to a less than 10 dB input signal, a 10 dB to 20 dB input signal, and a greater than 20 dB input signal, respectively. Given these example compression signal values, an input signal with a 30 dB dynamic range can then have a compressed dynamic range of only 17.5 dB based on 10 dB for the first 10 dB of input signal, 5 dB for the next 10 dB of input signal, and 2.5 dB for the next 10 dB of input signal. The compressed signal with a range of about 17.5 dB can be less likely to cause intermodulation effects when amplified in comparison to a 30 dB range for amplification of an uncompressed input signal. Given that amplifier stages that are linear over larger input signal ranges are typically more expensive, step compression of the input signal range can allow for the use of less expensive amplifier stages.

At 850, method 800 can include generating a step compressed output signal based on the delayed input signal and the step compression signal. Generating the step compressed output signal can be performed on a combiner component, e.g., combiner component 280, 380, 480, 580, etc. Step compressed output signal can reduce average power to peak power in comparison to the input signal. This can reduce the need for highly linearized amplification stages prior to transmission of a high power RF signal to a receiver. Generally, step compression prior to amplification does increase the bandwidth burden by adding the transmission of step compression signal information to an RF channel.

At 860, method 800 can include facilitating access to the step compressed output signal and step compression signal information. At this point method 800 can end. Access to the step compressed output signal can facilitate amplification and transmission of the step compressed output signal. Further, access to the step compression signal information can facilitate transmission of the step compression signal information on an RF channel to enable a receiving device to decompress the received amplified and transmitted step compressed output signal.

Figure 9:
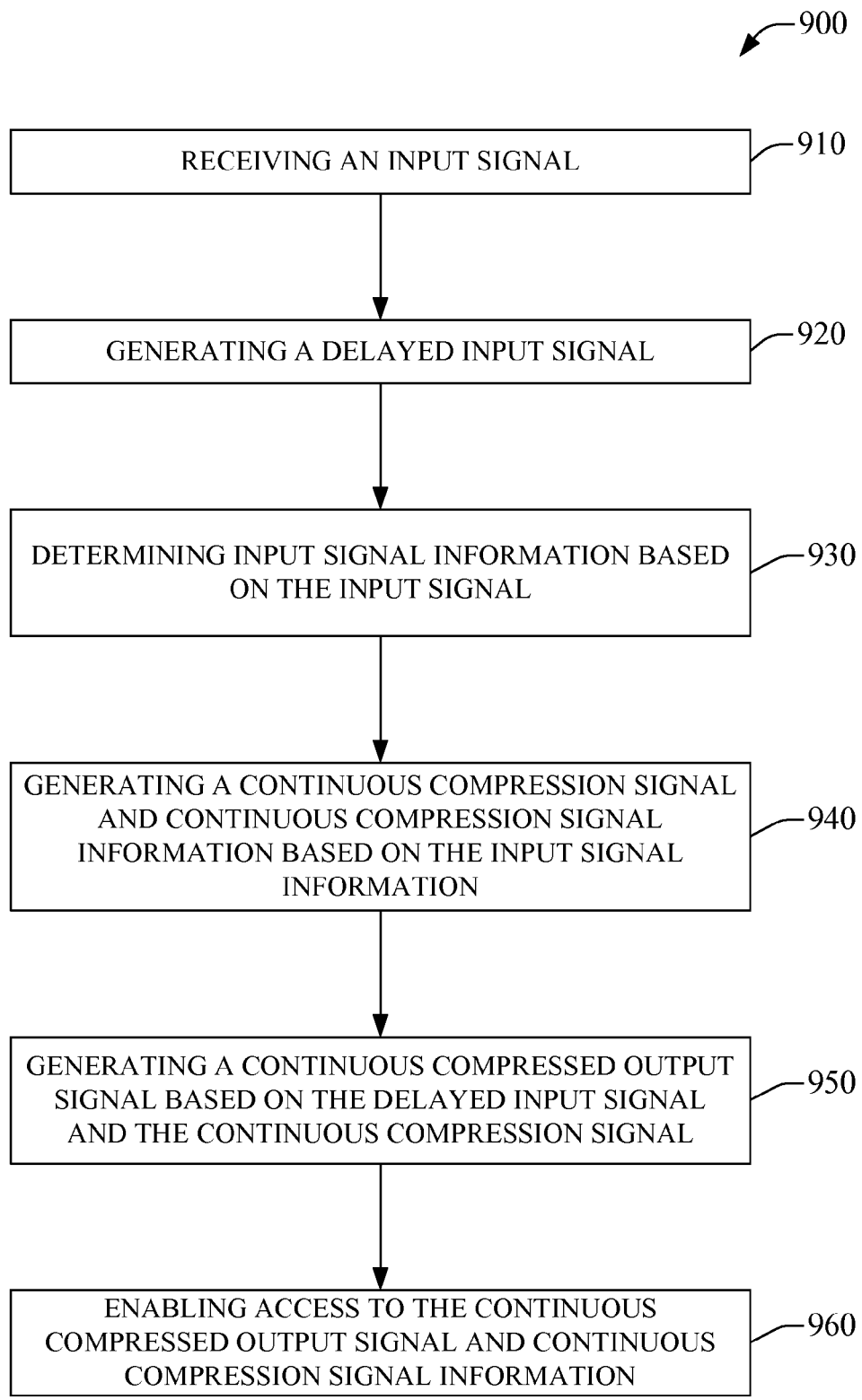
FIG. 9 illustrates a method facilitating generating a continuous compressed amplitude signal and continuous compression signal information in accordance with aspects of the subject disclosure.

FIG. 9 illustrates aspects of method 900 facilitating generating a continuous compressed amplitude signal and continuous compression signal information in accordance with aspects of the subject disclosure. At 910, method 900 can include receiving an input signal, such as a low power RF signal or a time variant signal such as that produced by a radio modulator. At 920, method 900 can comprise generating a delayed input signal. The delayed input signal can be based on the input signal received at 910. At 930, method 900 can include determining input signal information based on the input signal received at 910. Input signal information can be determined from an analysis of the input signal. Input signal information can be employed in determining a compression function to apply to the input signal to compress the amplitude of the input signal.

At 940, method 900 can generate a continuous compression signal and continuous compression signal information. The continuous compression signal and continuous compression signal information can be based on the input signal information from 930. In an embodiment, the continuous compression signal can be convolved with the delayed input signal to generate a continuous compressed output signal. Further, the continuous compression signal information can comprise information related to the continuous compression signal. Continuous compression signal information can be transmitted to a receiver device to enable the receiver to decompress a received continuous compressed output signal after amplification, transmission, and reception by the receiver device. In an aspect, continuous compression signal information can comprise a continuous compression function, information related to determining a continuous compression function, a continuous compression signal, information related to generating a continuous compression signal, an identifier of a continuous compression function or continuous compression signal used for continuous compression of a delayed input signal, etc.

A continuous compression signal can facilitate compression as a continuous function of the input signal level. As an example, as the input signal amplitude increases, the level of compression applied can correspondingly increase. Continuous compression can comprise linear compression functions or nonlinear compression functions, e.g., a quadratic compression, an exponential compression, etc. This can provide for changing levels of compression over a continuous range of input signal amplitudes. A linear compression function can be, for example, 0.1 dB per dB of input power, such that at an input signal level of 10 dB there is 1 dB of compression, at an input of 15 dB there is 1.5 dB of compression, at 30 dB there is 3 dB of compression, etc. A nonlinear compression function can be, for example, quadratic where compression is equal to 0.01 times the square of the input signal level, such that, at 10 dB there is 1 dB of compression, at 15 dB there is 2.25 dB of compression, at 30 dB there is 9 dB of compression, etc. Nearly any basic or complex function can be employed for continuous compression. A continuous compressed output signal can be less likely to cause intermodulation effects when amplified.

At 950, method 900 can include generating a continuous compressed output signal based on the delayed input signal and the continuous compression signal. Generating the continuous compressed output signal can be performed on a combiner component, e.g., combiner component 280, 380, 480, 580, etc. Continuous compressed output signal can reduce peak power to average power in comparison to the input signal. This can reduce the need for highly linearized amplification stages prior to transmission of a high power RF signal to a receiver.

At 960, method 900 can include facilitating access to the continuous compressed output signal and continuous compression signal information. At this point method 900 can end. Access to the continuous compressed output signal can facilitate amplification and transmission of the continuous compressed output signal. Further, access to the continuous compression signal information can facilitate transmission of the continuous compression signal information on an RF channel to enable a receiving device to decompress the received amplified and transmitted continuous compressed output signal.

Figure 10:
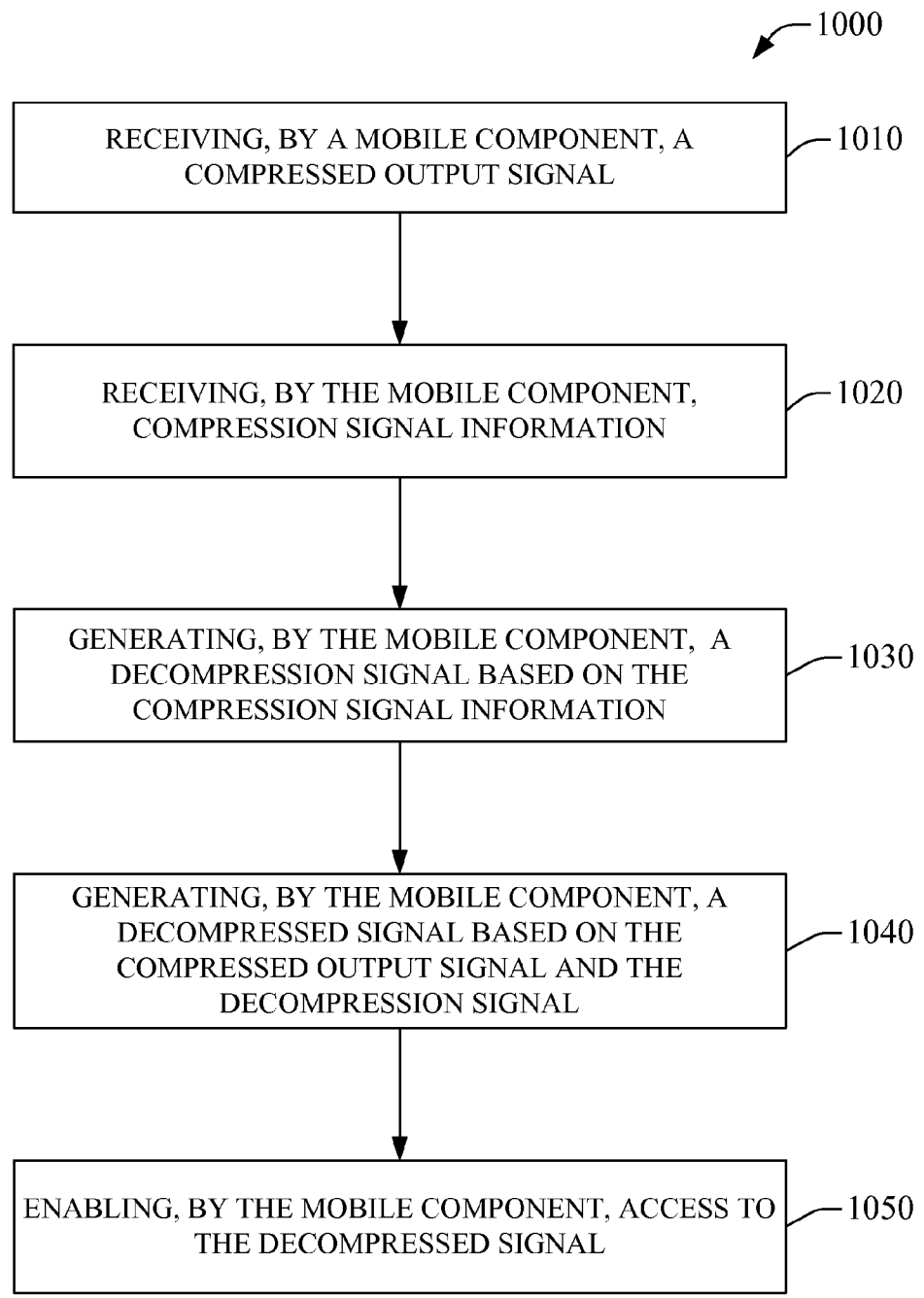
FIG. 10 illustrates a method facilitating generating a decompressed signal based on a compressed output signal and compression signal information in accordance with aspects of the subject disclosure.

FIG. 10 illustrates aspects of method 1000 facilitating generating a decompressed signal based on a compressed output signal and compression signal information in accordance with aspects of the subject disclosure. At 1010, method 1000 can include receiving, by a mobile component, a compressed output signal. The compressed output signal can be the same as that generated at 750 of method 700, etc. A mobile component can be a mobile device or can be comprised in a mobile device. A mobile device can be, for example, a mobile phone, a tablet computer, a smartphone, a vehicle, etc.

At 1020, method 1000 can include receiving compression signal information by the mobile component. Compression signal information can comprise information relating to the compression of the compressed output signal received at 1010. In an embodiment, compression signal information can be the same as generated in 740 of method 700, etc. Compression signal information can enable decompression of the compressed output signal received at 1010.

At 1030, generating, by the mobile device component, a decompression signal can be included in method 1000. Generating the decompression signal can be based on the compression signal information from 1020. Where the compression scheme is known, a decompression scheme can be determined. The decompression signal can be convolved with the compressed output signal to generate a decompressed signal that is a facsimile of an input signal used to generate the compressed output signal.

At 1040, method 1000 can comprise generating a decompressed signal by the mobile component. The decompressed signal can be based on the compressed output signal and the decompression signal. In an embodiment, on the compressed output signal and the decompression signal can be combined, for example, by a combiner component such as 280, 380, etc., to generate the decompressed signal.

At 1050, the mobile device can facilitate access to the decompressed signal as part of method 1000. At this point method 1000 can end. Access to the decompressed signal can be by other components of a mobile device comprising the mobile component. As an example, a mobile phone comprising the mobile component can access the decompressed signal for further processing associated with employing the decompressed signal in a manner similar to receiving an input signal.

Figure 11:
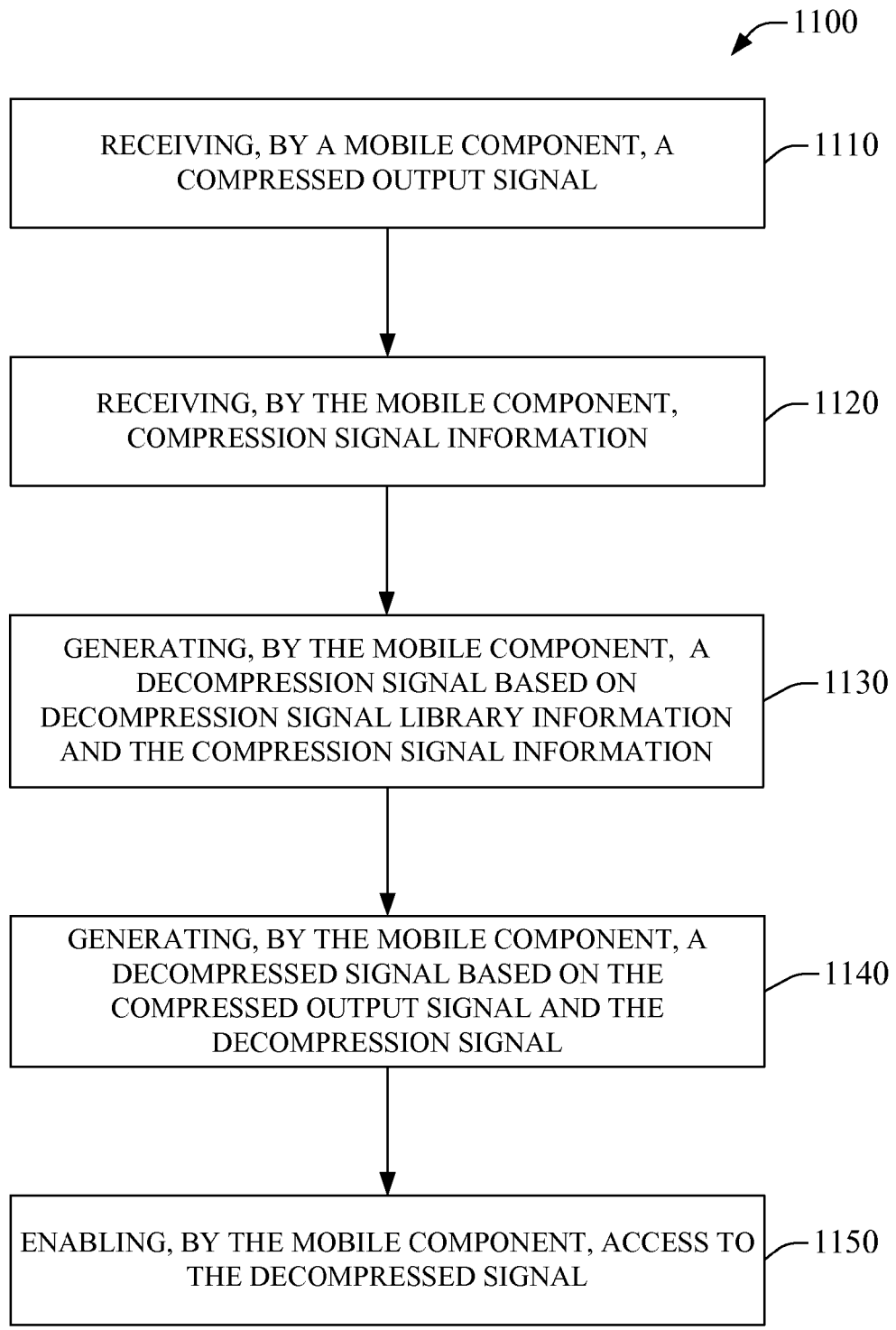
FIG. 11 illustrates a method facilitating generating a decompressed signal based on a compressed output signal, compression signal information, and a decompression signal library, in accordance with aspects of the subject disclosure.

FIG. 11 illustrates aspects of method 1100 facilitating generating a decompressed signal based on a compressed output signal, compression signal information, and a decompression signal library, in accordance with aspects of the subject disclosure. At 1110, method 1100 can include receiving, by a mobile component, a compressed output signal. The compressed output signal can be the same as that generated at 750 of method 700, etc. A mobile component can be a mobile device or can be comprised in a mobile device. A mobile device can be, for example, a mobile phone, a tablet computer, a smartphone, a vehicle, etc.

At 1120, method 1100 can include receiving compression signal information by the mobile component. Compression signal information can comprise information relating to the compression of the compressed output signal received at 1110. In an embodiment, compression signal information can be the same as generated in 740 of method 700, etc. Compression signal information can enable decompression of the compressed output signal received at 1110.

At 1130, method 1100 can comprise generating, by the mobile device component, a decompression signal. Generating the decompression signal can be based on decompression signal library information and the compression signal information from 1120. The decompression signal can be mixed with the compressed output signal to generate a decompressed signal that is a version of an input signal used to generate the compressed output signal. In an embodiment, the decompression signal library information can be related to a decompression signal stored on the mobile component or a device comprising the mobile component. The decompression signal library can allow a decompression signal to be received locally rather than by transmitting the decompression signal between a compressing device and the mobile component. In some embodiments, the decompression signal library can be updated to modify, delete, or add a decompression signal.

At 1140, method 1100 can comprise generating a decompressed signal by the mobile component. The decompressed signal can be based on the compressed output signal and the decompression signal from 1130. In an embodiment, the compressed output signal and the decompression signal can be combined, for example, by a combiner component such as 280, 380, etc., to generate the decompressed signal.

At 1150, the mobile device can facilitate access to the decompressed signal as part of method 1100. At this point method 1100 can end. Access to the decompressed signal can be by other components of a mobile device comprising the mobile component. As an example, a mobile phone comprising the mobile component can access the decompressed signal for further processing associated with employing the decompressed signal in a manner similar to receiving an input signal.

Figure 12:
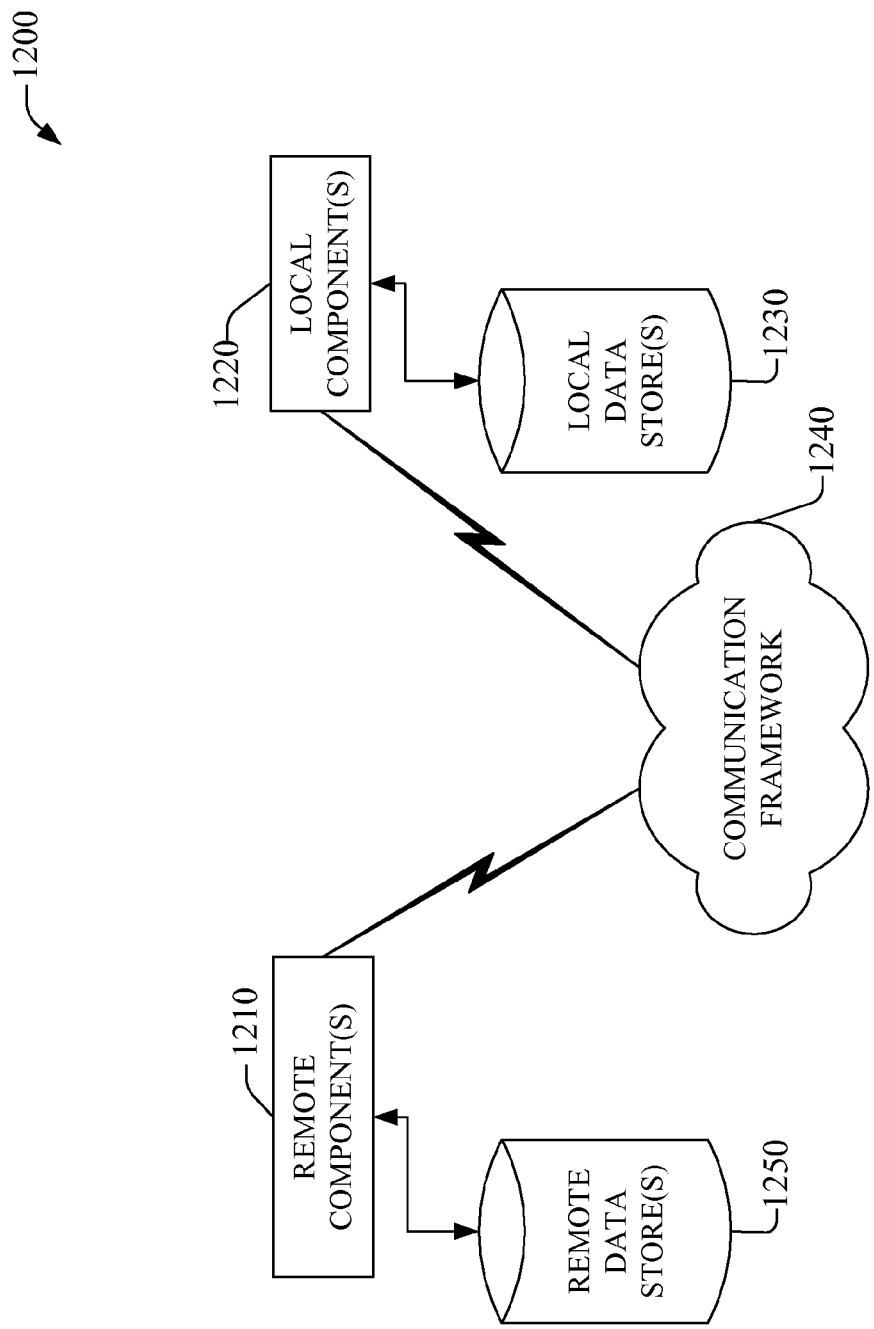
FIG. 12 depicts a schematic block diagram of a computing environment with which the disclosed subject matter can interact.

FIG. 12 is a schematic block diagram of a computing environment 1200 with which the disclosed subject matter can interact. The system 1200 includes one or more remote component(s) 1210. The remote component(s) 1210 can be hardware and/or software (e.g., threads, processes, computing devices). In some embodiments, remote component(s) 1210 can include servers, wireless telecommunication network devices, etc. As an example, remote component(s) 1210 can be a device of a wireless carrier network, e.g., a RAN component, NodeB, land mobile radio RF transmitter, etc., and can include compression component(s) 110, 210, 310, 410, etc. As another example, remote component(s) 1210 can be a server associated with a cloud computing provider device.

The system 1200 also includes one or more local component(s) 1220. The local component(s) 1220 can be hardware and/or software (e.g., threads, processes, computing devices). In some embodiments, local component(s) 1220 can include mobile component(s) 510, 610, etc. As an example, local component(s) 1220 can be a smartphone comprising mobile component 510.

One possible communication between a remote component(s) 1210 and a local component(s) 1220 can be in the form of a data packet adapted to be transmitted between two or more computer processes. Another possible communication between a remote component(s) 1210 and a local component(s) 1220 can be in the form of circuit-switched data adapted to be transmitted between two or more computer processes in radio time slots. As an example, driver profile information, other vehicle profile information, instant vehicle profile information, etc., can be communicated over a packet-switched or circuit-switched channels between a server device, e.g., remote component 1210, and a mobile device, e.g., a local component 1220, over an air interface, such as on a packet-switched or circuit-switched downlink channel. The system 1200 includes a communication framework 1240 that can be employed to facilitate communications between the remote component(s) 1210 and the local component(s) 1220, and can include an air interface, e.g., Uu interface of a UMTS network. Remote component(s) 1210 can be operably connected to one or more remote data store(s) 1250 that can be employed to store information on the remote component(s) 1210 side of communication framework 1240, for example, analysis component 260, 360, 460, etc. can comprise a data store to facilitate analysis of signal in. Similarly, local component(s) 1220 can be operably connected to one or more local data store(s) 1230, that can be employed to store information, decompression signal information on decompression signal library component 690, etc., on the to the local component(s) 1220 side of communication framework 1240.

Figure 13:
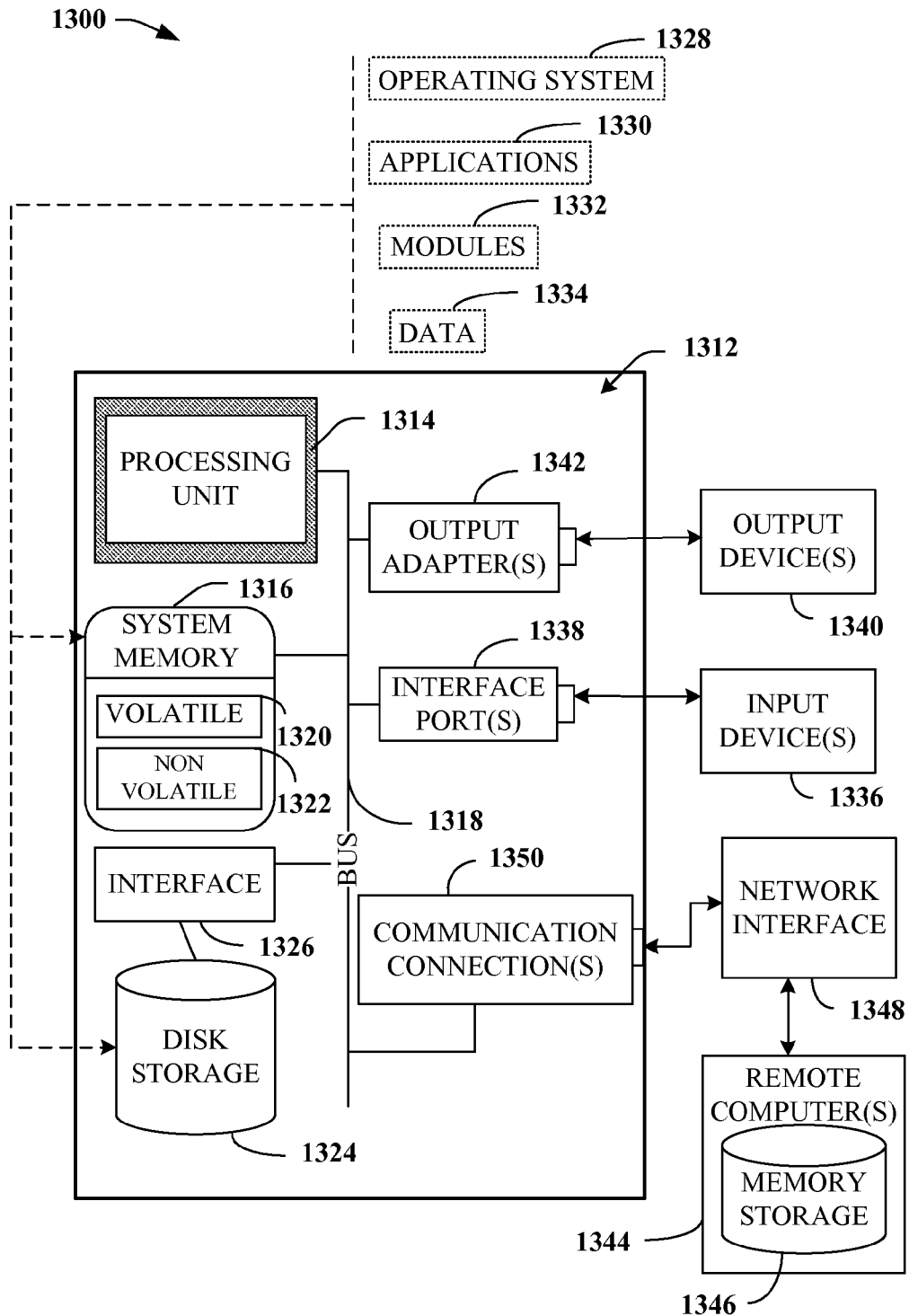
FIG. 13 illustrates a block diagram of a computing system operable to execute the disclosed systems and methods in accordance with an embodiment.

In order to provide a context for the various aspects of the disclosed subject matter, FIG. 13, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules include routines, programs, components, data structures, etc. that performs particular tasks and/or implement particular abstract data types.

In the subject specification, terms such as "store," "storage," "data store," data storage," "database," and substantially any other information storage component relevant to operation and functionality of a component, refer to "memory components," or entities embodied in a "memory" or components comprising the memory. It is noted that the memory components described herein can be either volatile memory or nonvolatile memory, or can include both volatile and non-volatile memory, by way of illustration, and not limitation, volatile memory 1320 (see below), non-volatile memory 1322 (see below), disk storage 1324 (see below), and memory storage 1346 (see below). Further, nonvolatile memory can be included in read only memory, programmable read only memory, electrically programmable read only memory, electrically erasable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, including single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 13 illustrates a block diagram of a computing system 1300 operable to execute the disclosed systems and methods in accordance with an embodiment. Computer 1312, which can be, for example, part of compression component 110, 210, 310, 410, etc., mobile component 510, 610, etc., library update component 692, etc., or employing method 700, 800, 900, 1000, or 1100, etc., includes a processing unit 1314, a system memory 1316, and a system bus 1318. System bus 1318 couples system components including, but not limited to, system memory 1316 to processing unit 1314. Processing unit 1314 can be any of various available processors. Dual microprocessors and other multiprocessor architectures also can be employed as processing unit 1314.

System bus 1318 can be any of several types of bus structure(s) including a memory bus or a memory controller, a peripheral bus or an external bus, and/or a local bus using any variety of available bus architectures including, but not limited to, industrial standard architecture, micro-channel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 1194), and small computer systems interface.

System memory 1316 can include volatile memory 1320 and nonvolatile memory 1322. A basic input/output system, containing routines to transfer information between elements within computer 1312, such as during start-up, can be stored in nonvolatile memory 1322. By way of illustration, and not limitation, nonvolatile memory 1322 can include read only memory, programmable read only memory, electrically programmable read only memory, electrically erasable read only memory, or flash memory. Volatile memory 1320 includes read only memory, which acts as external cache memory. By way of illustration and not limitation, read only memory is available in many forms such as synchronous random access memory, dynamic read only memory, synchronous dynamic read only memory, double data rate synchronous dynamic read only memory, enhanced synchronous dynamic read only memory, Synchlink dynamic read only memory, Rambus direct read only memory, direct Rambus dynamic read only memory, and Rambus dynamic read only memory.

Computer 1312 can also include removable/non-removable, volatile/non-volatile computer storage media. FIG. 13 illustrates, for example, disk storage 1324. Disk storage 1324 includes, but is not limited to, devices like a magnetic disk drive, floppy disk drive, tape drive, flash memory card, or memory stick. In addition, disk storage 1324 can include storage media separately or in combination with other storage media including, but not limited to, an optical disk drive such as a compact disk read only memory device, compact disk recordable drive, compact disk rewritable drive or a digital versatile disk read only memory. To facilitate connection of the disk storage devices 1324 to system bus 1318, a removable or non-removable interface is typically used, such as interface 1326.

Computing devices typically include a variety of media, which can include computer-readable storage media or communications media, which two terms are used herein differently from one another as follows.

Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not only propagating intangible signals per se. In an aspect, tangible media can include non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

It can be noted that FIG. 13 describes software that acts as an intermediary between users and computer resources described in suitable operating environment 1300. Such software includes an operating system 1328. Operating system 1328, which can be stored on disk storage 1324, acts to control and allocate resources of computer system 1312. System applications 1330 take advantage of the management of resources by operating system 1328 through program modules 1332 and program data 1334 stored either in system memory 1316 or on disk storage 1324. It is to be noted that the disclosed subject matter can be implemented with various operating systems or combinations of operating systems.

A user can enter commands or information into computer 1312 through input device(s) 1336. As an example, a user interface can be embodied in a touch sensitive display panel allowing a user to interact with computer 1312. Input devices 1336 include, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1314 through system bus 1318 by way of interface port(s) 1338. Interface port(s) 1338 include, for example, a serial port, a parallel port, a game port, a universal serial bus, an infrared port, a Bluetooth port, an IP port, or a logical port associated with a wireless service, etc. Output device(s) 1340 use some of the same type of ports as input device(s) 1336.

Thus, for example, a universal serial busport can be used to provide input to computer 1312 and to output information from computer 1312 to an output device 1340. Output adapter 1342 is provided to illustrate that there are some output devices 1340 like monitors, speakers, and printers, among other output devices 1340, which use special adapters. Output adapters 1342 include, by way of illustration and not limitation, video and sound cards that provide means of connection between output device 1340 and system bus 1318. It should be noted that other devices and/or systems of devices provide both input and output capabilities such as remote computer(s) 1344.

Computer 1312 can operate in a networked environment using logical connections to one or more remote computers, such as remote computer(s) 1344. Remote computer(s) 1344 can be a personal computer, a server, a router, a network PC, cloud storage, cloud service, a workstation, a microprocessor based appliance, a peer device, or other common network node and the like, and typically includes many or all of the elements described relative to computer 1312.

For purposes of brevity, only a memory storage device 1346 is illustrated with remote computer(s) 1344. Remote computer(s) 1344 is logically connected to computer 1312 through a network interface 1348 and then physically connected by way of communication connection 1350. Network interface 1348 encompasses wire and/or wireless communication networks such as local area networks and wide area networks. Local area network technologies include fiber distributed data interface, copper distributed data interface, Ethernet, Token Ring and the like. Wide area network technologies include, but are not limited to, point-to-point links, circuit-switching networks like integrated services digital networks and variations thereon, packet switching networks, and digital subscriber lines. As noted below, wireless technologies may be used in addition to or in place of the foregoing.

Communication connection(s) 1350 refer(s) to hardware/software employed to connect network interface 1348 to bus 1318. While communication connection 1350 is shown for illustrative clarity inside computer 1312, it can also be external to computer 1312. The hardware/software for connection to network interface 1348 can include, for example, internal and external technologies such as modems, including regular telephone grade modems, cable modems and digital subscriber line modems, integrated services digital network adapters, and Ethernet cards.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

Further, the term "include" is intended to be employed as an open or inclusive term, rather than a closed or exclusive term. The term "include" can be substituted with the term "comprising" and is to be treated with similar scope, unless otherwise explicitly used otherwise. As an example, "a basket of fruit including an apple" is to be treated with the same breadth of scope as, "a basket of fruit comprising an apple."

Moreover, terms like "user equipment (UE)," "mobile station," "mobile," subscriber station," "subscriber equipment," "access terminal," "terminal," "handset," and similar terminology, refer to a wireless device utilized by a subscriber or user of a wireless communication service to receive or convey data, control, voice, video, sound, gaming, or substantially any data-stream or signaling-stream. The foregoing terms are utilized interchangeably in the subject specification and related drawings. Likewise, the terms "access point," "base station," "Node B," "evolved Node B," "home Node B," "home access point," and the like, are utilized interchangeably in the subject application, and refer to a wireless network component or appliance that serves and receives data, control, voice, video, sound, gaming, or substantially any data-stream or signaling-stream to and from a set of subscriber stations or provider enabled devices. Data and signaling streams can include packetized or frame-based flows.

Additionally, the terms "core-network", "core", "core carrier network", "carrier-side", or similar terms can refer to components of a telecommunications network that typically provides some or all of aggregation, authentication, call control and switching, charging, service invocation, or gateways. Aggregation can refer to the highest level of aggregation in a service provider network wherein the next level in the hierarchy under the core nodes is the distribution networks and then the edge networks. UEs do not normally connect directly to the core networks of a large service provider but can be routed to the core by way of a switch or radio access network. Authentication can refer to determinations regarding whether the user requesting a service from the telecom network is authorized to do so within this network or not. Call control and switching can refer determinations related to the future course of a call stream across carrier equipment based on the call signal processing. Charging can be related to the collation and processing of charging data generated by various network nodes. Two common types of charging mechanisms found in present day networks can be prepaid charging and postpaid charging. Service invocation can occur based on some explicit action (e.g. call transfer) or implicitly (e.g., call waiting). It is to be noted that service "execution" may or may not be a core network functionality as third party network/nodes may take part in actual service execution. A gateway can be present in the core network to access other networks. Gateway functionality can be dependent on the type of the interface with another network.

Furthermore, the terms "user," "subscriber," "customer," "consumer," "prosumer," "agent," and the like are employed interchangeably throughout the subject specification, unless context warrants particular distinction(s) among the terms. It should be appreciated that such terms can refer to human entities or automated components (e.g., supported through artificial intelligence, as through a capacity to make inferences based on complex mathematical formalisms), that can provide simulated vision, sound recognition and so forth.

Aspects, features, or advantages of the subject matter can be exploited in substantially any, or any, wired, broadcast, wireless telecommunication, radio technology or network, or combinations thereof. Non-limiting examples of such technologies or networks include broadcast technologies (e.g., sub-Hertz, extremely low frequency, very low frequency, low frequency, medium frequency, high frequency, very high frequency, ultra-high frequency, super-high frequency, terahertz broadcasts, etc.); Ethernet; X.25; powerline-type networking, e.g., Powerline audio video Ethernet, etc; femto-cell technology; Wi-Fi; worldwide interoperability for microwave access; enhanced general packet radio service; third generation partnership project, long term evolution; third generation partnership project universal mobile telecommunications system; third generation partnership project 2, ultra mobile broadband; high speed packet access; high speed downlink packet access; high speed uplink packet access; enhanced data rates for global system for mobile communication evolution radio access network; universal mobile telecommunications system terrestrial radio access network; or long term evolution advanced.

What has been described above includes examples of systems and methods illustrative of the disclosed subject matter. It is, of course, not possible to describe every combination of components or methods herein. One of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A device, comprising:
   a memory to store executable instructions; and
   a processor coupled to the memory, that facilitates execution of the executable instructions to perform operations, comprising:
      receiving an input signal having a time variant amplitude;
      generating a delayed input signal based on the input signal and a time associated with determining a compression function related to compression of the input signal having the time variant amplitude;
      determining the compression function related to compression of the input signal having the time variant amplitude;
      generating a compressed signal based on the compression function and the delayed input signal;
      generating compression signal information related to the compression function;
      enabling access to the compression signal information to enable decompression of a version of the compressed signal by a mobile device; and
      enabling access to the compressed signal to enable amplification of the compressed signal and transmission of the amplification of the compressed signal via a wireless interface associated with the mobile device.

2. The device of claim 1, wherein the determining the compression function is based on amplifier information related to an amplification parameter of an amplifier to be employed in amplifying the compressed signal.

3. The device of claim 1, wherein the compression function is a step compression function comprising a first discrete level of amplitude compression associated with a first range of the input signal having the time variant amplitude and a second discrete level of amplitude compression associated with a second range of the input signal having the time variant amplitude.

4. The device of claim 1, wherein the compression function is a continuous compression function comprising a continuous function associated with amplitude compression of the input signal having the time variant amplitude.

5. The device of claim 4, wherein the continuous compression function comprises a quadratic function associated with amplitude compression of the input signal having the time variant amplitude.

6. The device of claim 4, wherein the continuous compression function comprises an exponential function associated with amplitude compression of the input signal having the time variant amplitude.

7. The device of claim 1, wherein the compression signal information comprises the compression signal.

8. The device of claim 1, wherein the compression signal information comprises an identifier associated with the compression signal.

9. A method, comprising:
receiving, by a system comprising a processor, an input signal having a time variant amplitude;
generating, by the system, a delayed input signal based on the input signal and a time associated with determining a compression function related to compression of the time variant amplitude of the input signal;
determining, by the system, the compression function related to compression of the time variant amplitude of the input signal based on amplifier information related to an amplification parameter of an amplifier to be employed in amplifying a compressed signal;
generating, by the system, the compressed signal based on the compression function and the delayed input signal;
generating, by the system, compression signal information related to the compression function;
facilitating, by the system, access to the compression signal information to enable decompression of a version of the compressed signal received by a mobile device via a wireless interface; and
facilitating, by the system, access to the compressed signal to enable amplification of the compressed signal by the amplifier, wherein the amplification of the compressed signal satisfies a defined condition for high power radio frequency transmission via the wireless interface.

10. The method of claim 9, wherein the determining the compression function comprises determining a step compression function comprising a first discrete level of amplitude compression associated with a first range of the time variant amplitude and a second discrete level of amplitude compression, different from the first discrete level, associated with a second range of the time variant amplitude different from the first range.

11. The method of claim 9, wherein the determining the compression function comprises determining a continuous compression function comprising a continuous function associated with amplitude compression of the time variant amplitude.

12. The method of claim 11, wherein the continuous compression function comprises a linear function associated with amplitude compression of the time variant amplitude.

13. The method of claim 11, wherein the continuous compression function comprises a nonlinear function associated with amplitude compression of the time variant amplitude.

14. The method of claim 9, wherein the generating the compression signal information comprises generating information that comprises the compression signal.

15. The method of claim 9, wherein the generating the compression signal information comprises generating information that comprises an identifier associated with the compression signal.

16. A mobile device, comprising:
a memory to store executable instructions; and
a processor coupled to the memory, that facilitates execution of the executable instructions to perform operations, comprising:
receiving a compressed signal having a compressed time variant amplitude via a wireless network interface;
receiving compression signal information via the wireless network interface;
generating a delayed input signal based on the compressed signal and a time associated with determining a decompression function related to decompression of the compression of the time variant amplitude of the compressed signal;
determining the decompression function related to decompression of the compression of the time variant amplitude of the compressed signal based on the compression signal information;
receiving a decompression signal based on the decompression function; and
generating a decompressed signal based on the delayed input signal and the decompression signal.

17. The mobile device of claim 16, wherein the decompression signal is generated based on the decompression function.

18. The mobile device of claim 16, wherein the decompression signal is received from a data store comprising decompression signal information.

19. The mobile device of claim 18, wherein the decompression signal is received from the data store based on a decompression signal identifier of the compression signal information.

20. The mobile device of claim 18, wherein the decompression signal information is updated from a remotely located update device.

* * * * *